United States Patent
Kaneko

(10) Patent No.: US 7,157,743 B2
(45) Date of Patent: Jan. 2, 2007

(54) SURFACE-EMITTING LIGHT-EMITTING DEVICE AND METHOD OF MANUFACTURING THE SAME, OPTICAL MODULE, AND LIGHT-TRANSMISSION DEVICE

(75) Inventor: Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 49 days.

(21) Appl. No.: 10/373,799

(22) Filed: Feb. 27, 2003

(65) Prior Publication Data

US 2003/0197184 A1 Oct. 23, 2003

(30) Foreign Application Priority Data

Mar. 1, 2002 (JP) .............................. 2002-055983

(51) Int. Cl.
*H01L 33/00* (2006.01)
(52) U.S. Cl. ............................. 257/98; 257/79; 257/81; 257/94; 257/99
(58) Field of Classification Search ........... 257/79–103
See application file for complete search history.

(56) References Cited

U.S. PATENT DOCUMENTS

| | | | | |
|---|---|---|---|---|
| 4,342,944 A | * | 8/1982 | SpringThorpe | 313/499 |
| 5,348,617 A | * | 9/1994 | Braymen | 216/2 |
| 5,905,275 A | * | 5/1999 | Nunoue et al. | 257/95 |
| 5,966,399 A | * | 10/1999 | Jiang et al. | 372/96 |
| 5,972,731 A | * | 10/1999 | Dutta | 438/39 |
| 6,320,893 B1 | * | 11/2001 | Ueki | 372/96 |
| 6,683,732 B1 | * | 1/2004 | Maeda et al. | 359/811 |
| 6,888,165 B1 | * | 5/2005 | Hayakawa | 257/79 |
| 2002/0044582 A1 | | 4/2002 | Kondo | |
| 2002/0088980 A1 | * | 7/2002 | Wipiejewski | 257/79 |

FOREIGN PATENT DOCUMENTS

| | | |
|---|---|---|
| DE | 199 35 496 C1 | 1/2001 |
| EP | 0 740 376 A1 | 10/1996 |
| EP | 1 263 098 A2 | 12/2002 |
| JP | A-56-46574 | 4/1981 |
| JP | 60-A-130873 | 7/1985 |
| JP | A 02-045994 | 2/1990 |
| JP | A 02-054589 | 2/1990 |
| JP | 02-A-185729 | 7/1990 |
| JP | A 04-297023 | 10/1992 |
| JP | 7-A-7184 | 1/1995 |

(Continued)

OTHER PUBLICATIONS

U.S. Appl. No. 10/092,777, filed Mar. 8, 2002, Tsuyoshi Kaneko et al.

(Continued)

*Primary Examiner*—Wai-Sing Louie
(74) *Attorney, Agent, or Firm*—Oliff & Berridge, PLC

(57) ABSTRACT

A surface-emitting light-emitting device, which can control optical characteristics of emitting light and the manufacturing method thereof, an optical module which includes the surface-emitting light-emitting device, and a light-transmission device are provided. A surface-emitting light-emitting device includes an emitting surface for light emission and a bank that is formed so as to surround the emitting surface. An upper edged portion of the bank is located at a position higher than the emitting surface.

22 Claims, 14 Drawing Sheets

FOREIGN PATENT DOCUMENTS

| | | |
|---|---|---|
| JP | 10-A-261830 | 9/1998 |
| JP | 11-A-261153 | 9/1999 |
| JP | A-2000-2802 | 1/2000 |
| JP | 2000-067449 | 3/2000 |
| JP | A 2001-284725 | 10/2001 |
| JP | 2003-A-198061 | 7/2003 |

OTHER PUBLICATIONS

Achyut Kumar Dutta et al., "High Brightness, AlGaInP-Based, Visible Light-Emitting Diode for Efficient Coupling with POF", IEEE Photonics Technology Letters, Oct. 1995, vol. 7, No. 10, pp. 1041-1135.

* cited by examiner

SURFACE-EMITTING LIGHT-EMITTING DEVICE AND METHOD OF MANUFACTURING THE SAME, OPTICAL MODULE, AND LIGHT-TRANSMISSION DEVICE Japanese Patent Application No. 2002-55983 filed on Mar. 1, 2003 is hereby incorporated by reference in its entirety.

BACKGROUND OP THE INVENTION

The present invention is related to a surface-emitting light-emitting device and a method of manufacturing the same, an optical module including the surface-emitting light-emitting device and a light-transmission device.

A surface-emitting light-emitting device such as a surface-emitting semiconductor laser is highly expected as a device for optical transmission, optical computation and various sensing. In this application, it is necessary to control optical characteristics of emitted light such as radiation angle and a wavelength of light depending on the situation. In this case, such optical characteristics of emitted light can be controlled by installing a given optical member.

BRIEF SUMMARY OF THE INVENTION

The object of the present invention is to provide a surface-emitting light-emitting device that can control optical characteristics of emitting light and method of manufacturing the same.

Further, the object of the present invention is to provide an optical module including the surface-emitting light-emitting device and a light-transmission device.

The Surface-emitting Light-emitting Device

One aspect of the present invention relates to a surface-emitting light-emitting device which emits light in a direction perpendicular to a base, the surface-emitting light-emitting device comprising:

an emitting surface; and a bank which is formed so as to surround the emitting surface, wherein an upper edged portion of the bank is located at a position higher than the emitting surface.

Here, "the upper edged portion of the bank" means the edge closer to the emitting surface of the upper surface of the bank. Further, "base" means a substrate where a light-emitting element is formed. For example, it is a semiconductor substrate in a case of a surface-emitting semiconductor laser, a sapphire substrate in a case of a light-emitting semiconductor diode and a transparent substrate in a case of an EL element.

With this surface-emitting light-emitting device, an upper edged portion of the bank is located at a position higher than the emitting surface. Hence, the optical member can be installed stably thereby when the optical member is installed in an area inside the bank. Thus, characteristics of light emitting from the emitting surface can be controlled effectively.

This surface-emitting light-emitting device of the present invention may have the following features (1) to (8).

(1) The upper edged portion of the bank may be located at a position higher than the emitting surface by at least 0.5 µm.

(2) An upper surface of the bank may be located at a position higher than the emitting surface.

(3) The bank may be formed of an insulating material.

(4) the bank may be formed of polyimide type resin or fluoride type resin.

(5) An optical member may be formed above the emitting surface. Here, the optical member is defined as a member which has a function of changing optical characteristics of light emitting from an emitting element. Optical characteristics may be wavelength, polarization, emitting angle and the like. The optical member may be any one of a lens, an interference filter, a wavelength filter, a polarizing filter and a wavelength conversion member.

In this case, the optical member may be located in an area inside the bank.

Further, the optical member may be formed of an ultraviolet-cured resin.

(6) The surface-emitting light-emitting device may be a surface-emitting semiconductor laser. In this case, the following modes from (I) to (III) can be illustrated, (I) The base may be a semiconductor substrate, the surface-emitting semiconductor laser may include:

a resonator formed on the semiconductor substrate;

a columnar portion which constitutes at least a part of the resonator; and a insulating layer covering a side surface of the columnar portion, the emitting surface may be formed on an upper surface of the columnar portion, and a peripheral region of the columnar portion may function as the bank.

(II) The base may be a semiconductor substrate, the surface-emitting semiconductor laser may include a resonator formed on the semiconductor substrate, a recess may be formed at a lower surface of the semiconductor substrate, the emitting surface may be formed on an upper surface of the recess, and a peripheral region of the recess may function as the bank.

Here, a lower surface of the semiconductor substrate is defined as the opposite side of the surface where the resonator is installed.

(III) The base may be a semiconductor substrate, the surface-emitting semiconductor laser may include a resonator formed on the semiconductor substrate, a first recess may be formed at a lower surface of the semiconductor substrate, a layer for adjusting optical path may be buried in the first recess, a second recess may be formed in the layer for adjusting optical path, the emitting surface may be formed on an upper surface of the second recess, and a peripheral region of the columnar portion may function as the bank.

(7) The surface-emitting light-emitting device may be a light-emitting semiconductor diode.

The base may be a semiconductor substrate, the light-emitting semiconductor diode may include:

a light-emitting element section formed on the semiconductor substrate;

a columnar portion including an active layer which forms at least a part of the light-emitting element; and a insulating layer covering a side surface of the columnar portion, the emitting surface may be installed on the columnar portion, and a peripheral region of the columnar portion may function as the bank.

(8) The surface-emitting light-emitting device may be an EL element.

A Method of Manufacturing a Surface-emitting Light-emitting Device

Another aspect of the present invention relates to a method of manufacturing a surface-emitting light-emitting device which emits light in a direction perpendicular to a base, the method comprising the steps of:

(a) forming a portion which includes a light-emitting surface and works as a light-emitting element; and (b) forming a bank to surround the emitting surface and forming an upper surface of the bank to be higher than the emitting surface.

According to this method of manufacturing a surface-emitting light-emitting device of the present invention, the light-emitting device, in which optical characteristics of emitting light are effectively controlled, can be formed with a simple method.

(1) This method may further include the step of:

(c) forming an optical member above the emitting surface.

(2) Further, in this method, the step (c) may include forming a lens in an area inside the bank, the optical member being a lens. According to this step, a surface-emitting light-emitting device can be formed easily with high yield.

(3) Further, in the step (c), the step of forming the lens in the area inside the bank may include the following steps (c-1) and (c-2):

(c-1) ejecting a lens material into the area inside the bank by ink-jet method; and (c-2) curing the lens material.

According to this step, a surface-emitting light-emitting device can be formed easily with high yield.

(4) This method may further include the following step (d):

(d) adjusting a wetting angle of the lens material before implementing the step (c-1). According to this step, a desirable shape of a lens can be formed accurately inside of the region of the bank.

(5) In the case of (3) and (4), the lens material may be a precursor of an ultraviolet-cured resin. According to this step, it is possible to harden a lens member effectively in short time without including a process that gives any damages to an element such as thermal process. Thus, any effects to an element can be reduced thereby.

An Optical Module and a Light-transmission Device

The surface-emitting light-emitting device of the present invention can be applied to an optical module with an optical waveguide. Further, it can be applied to a light-transmission device.

DETAILED DESCRIPTION OF THE EMBODIMENT

Embodiments of the present invention will be described with reference to the accompanying drawings thereafter.

First Embodiment

Device Structure

Figure 1:
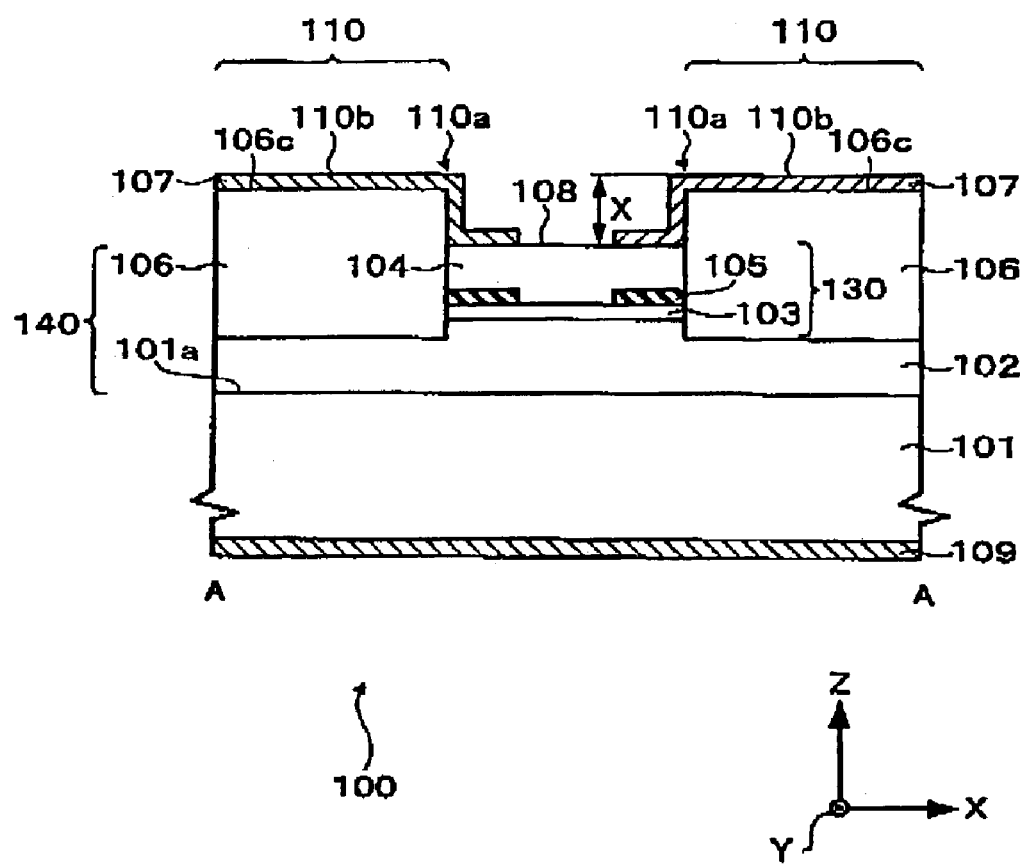
FIG. 1 is a cross sectional view schematically showing the surface-emitting light-emitting device according to a first embodiment of the present invention.
Figure 2:
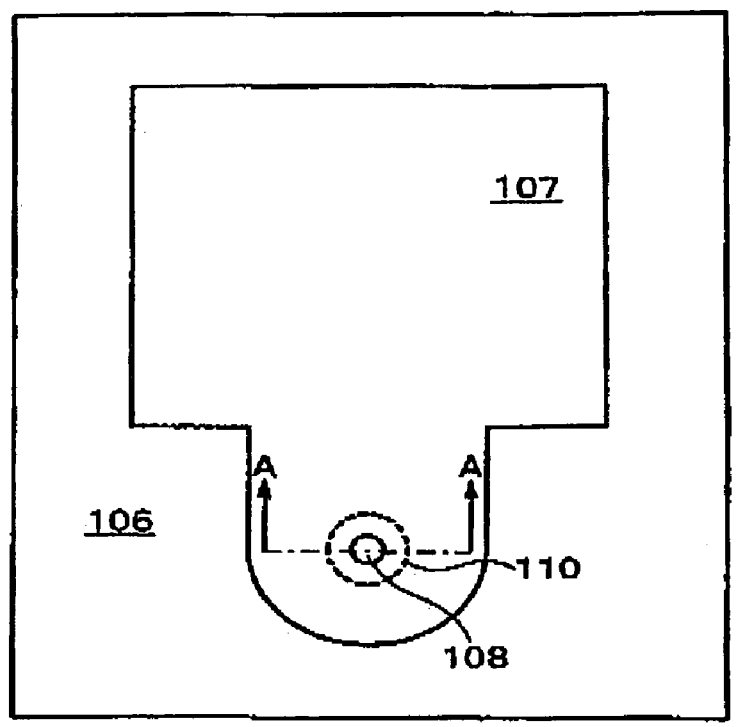
FIG. 2 is a plain view schematically showing the surface-emitting light-emitting device according to the first embodiment of the present invention.
Figure 2:
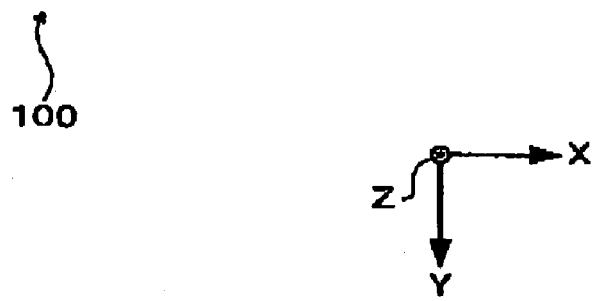

FIG. 1 is a cross sectional view schematically showing a surface-emitting light-emitting device 100 regarding the first embodiment of the present invention. FIG. 2 is a plain view schematically showing the surface-emitting light-emitting device 100 regarding the first embodiment of the present invention, FIG. 1 shows a cross section taken along a line A—A line in FIG. 2. Here, in this embodiment, a surface-emitting semiconductor later is used as a surface-emitting light-emitting device.

As shown in FIG. 1, the surface-emitting light-emitting device 100 of the present embodiment includes a semiconductor substrate (GaAs substrate in this embodiment) 101, a vertical resonator (a resonator hereunder) formed on the semiconductor substrate 101. The vertical resonator 140 includes a pillar-type semiconductor accumulation 130 (a columnar portion hereunder) and the side of the columnar portion 130 is covered by an insulating layer 106.

In the surface-emitting light-emitting device 100 of the present embodiment, the peripheral region of the columnar portion 130 works as a bank 110. Here, the peripheral region of the columnar portion 130 is defined as an area of the insulating layer 106 and a partial portion of a first electrode 107 formed on the upper surface 106c of the insulating layer 106.

As shown in FIG. 1, the surface-emitting light-emitting device 100 includes an emitting surface 108 where light is emitted and the bank 110 formed so as to surround the emitting surface 108. This emitting surface 108 is located on the upper surface of the columnar portion 130 and laser light is emitted form the emitting surface 108. In the surface-emitting light-emitting device 100 of the present embodiment, the part of the upper surface of the columnar portion 130, which is not covered with the first electrode 107, is corresponding to the emitting surface 108.

An upper edged portion 110a of the bank 110 is formed on the position higher than that of emitting surface 108. Here, the upper edged portion 110a of the bank 110 is defined as an edged portion of the upper surface 110b of the bank 110, which is adjacent to the emitting surface 108. In the surface-emitting light-emitting device 100 of the present embodiment, the upper edged portion 110a of the bank 110 is defined as an edged portion of the upper surface 110b of the bank 110, which is adjacent to the columnar portion 130.

Here, "the upper edged portion 110a of the bank 110 is formed on the position higher than that of emitting surface 108" means that the distance between the upper edged portion 110a of the bank 110 and the surface 101a where resonator is installed in the semiconductor substrate 101 is larger than the distance between the emitting surface 108 and the surface 110a where resonator is installed in the semiconductor substrate 101. Namely, it is defined that the larger distance between every element and the surface 101a where resonator is installed in the semiconductor substrate 101 is, the higher position is located, if the surface 101a where resonator is installed in the semiconductor substrate 101 is a basis.

For example, "the upper surface 110b of the bank 110 is higher than the emitting surface 108", which is described thereafter, means that the distance between the upper surface 110b of the bank 110 and the surface 101a where resonator is installed in the semiconductor substrate 101 is larger than the distance between the emitting surface 108 and the surface 101a where resonator is installed in the semiconductor substrate 101. This definition is applied to other embodiments.

Especially, it is preferable that the upper edged portion 110a of the bank 110 is located at the position which is higher than the emitting surface 108 by 0.5 μm. Namely, as shown in FIG. 1, it is preferable that the height X from the emitting surface 108 to the upper edged portion 110a of the bank 110 is more than 0.5 μm. Thus, the upper edged portion 110a of the bank 110 is formed at the position which is higher than the emitting surface 108 by 0.5 μm. An optical member such as lens can be installed with a stable state thereby, when the optical member is located on the emitting surface 108.

Further, as shown in FIG. 1, in the surface-emitting light-emitting device 100, it is preferable that the upper surface 110b of the bank 110 is higher than the emitting surface 108. An optical member such as above described can be installed with a more stable state thereby, when the optical member is located on the emitting surface 108.

Next, each element of the surface-emitting light-emitting device 100 will be described.

The surface-emitting light-emitting device 100 includes the semiconductor substrate 101 composed of n-type GaAs and the resonator 140 formed on the semiconductor substrate 101.

The columnar portion 130 is formed in the resonator 140. Here, the columnar portion 130 is a part of the resonator 140 and defined as a pillar-type semiconductor accumulation at least including an upper mirror 104. The columnar portion 130 is buried with the insulating layer 106. Namely, the side of the columnar portion 130 is surrounded by the insulating layer 106. Further, the first electrode 107 is formed on the columnar portion 130.

The resonator 140 comprises a structure including the following layers that are accumulated in order. Namely, these layers are, for example, a distributed reflective-type multi-layers mirror 102 (a lower mirror hereunder) composed of 40 pairs of a multi-layers of a n-type $Al_{0.9}Ga_{0.1}As$ layer and a n-type $Al_{0.15}Ga_{0.85}As$ layer which are accumulated alternatively, an active layer 103 which is composed of a GaAs well layer and a $Al_{0.3}Ga_{0.7}As$ barrier layer and includes a quantum well structure having triple well layers, and a distributed reflective-type multi-layers mirror 104 (an upper mirror hereunder) composed of 25 pairs of a multi-layers of a p-type $Al_{0.9}Ga_{0.1}As$ layer and a p-type $Al_{0.15}Ga_{0.85}As$ layer which are accumulated alternatively. Here, components and the numbers of layers comprising the lower mirror 102, the active layer 103 and the upper mirror 104 are not limited to the above-mentioned.

The upper mirror 104 comes to be a p-type by doping carbon, for example, and the lower mirror 102 comes to be an n-type by doping silicon, for example. Therefore, a PIN diode is formed as being composed of the upper mirror 104, the active layer 103 without impurity doping and the lower mirror 102.

Further, a portion in the resonator 140 from the laser-emitting site of the surface-emitting light-emitting device 100 to a part of the lower mirror 102 on its way is etched as circular shape viewed from the direction facing to the emitting surface 108 and the columnar portion 130 is formed thereby. Here, the plane shape of the columnar portion 130 is a circle in the present embodiment. However, it is possible to have one of any other shapes.

Further, an electric current constriction layer 105 made from oxide aluminum is formed in the region adjacent to the active layer 103, of layers for the upper mirror 104. The electric current constriction layer 105 is shaped as a ring like. Namely, the electric current constriction layer 105 has a shape where a cross section taken along with the plane in parallel with the X-Y plain in FIG. 1 is a concentric circle.

Further, in the surface-emitting light-emitting device 100, the insulating layer 106 is formed so to cover over the side of the columnar portion 130 and the lower mirror 102.

In the process for manufacturing the surface-emitting light-emitting device 100, firstly, the insulating layer 106 covering over the side of the columnar portion 130 is formed. Then, the first electrode 107 is formed on the upper surface of the columnar portion 130 and on the upper surface of the insulating layer 106 and a second electrode 109 is formed on a lower surface of the semiconductor substrate 101 thereafter. The lower surface of the semiconductor substrate is the surface opposite to the surface where the resonator 140 is installed according to the semiconductor substrate 101. In forming these electrodes, annealing is generally completed at around 400° C. (see the manufacturing process described hereafter). Therefore, when the insulating layer 106 is formed with resin, it is necessary that this resin is superior as to heat endurance in order to stand this annealing process. Thus, it is preferable that a resin for forming the insulating layer 106 is any one of, a polyimide resin, a fluorine resin, an acrylic acid resin and an epoxy resin in order to satisfy the above-mentioned condition. Especially, it is preferable that this should be a polyimide resin, or a fluorine resin, viewed from easiness in processing and insulation ability. Further, when an optical member such as lens is formed on the insulating layer 106 by using a resin as material for it, it is preferable that the insulating layer 106 is formed with a polyimide resin, or a fluorine resin since the contact angle with lens material (resin) is large and it is easy to control a lens shape. In this case, the insulating layer 106 is formed by curing a precursor through irradiation of heat or light energy, or chemical reaction.

Further, the first electrode 107 is formed on the columnar portion 130 and the insulating layer 106. Further, there is a region (an opening) where the first electrode 107 is not formed on the center of the columnar portion 130. This region is the emitting surface 108. The emitting surface 108 comes to be an opening for emitting laser light. The first electrode 107 is made of multi layers of an alloy of Au and Zn and Au.

Further, the second electrode 109 is formed on a lower surface of the semiconductor substrate 101. Namely, in the surface-emitting light-emitting device 100 shown in FIG. 1, the first electrode 107 is connected with the surface of the columnar portion 130 and the second electrode 109 is connected with the lower surface of the semiconductor substrate 1. Thus, electric current is charged into the active layer 103 via the first electrode 107 and the second electrode 109 thereby. The second electrode 109 is, for example, made of multi layers of an alloy of Au and Ge and Au.

The material for forming the first and second electrodes 107, 109 is not limited to the above mentioned. For example, metal such as Ti and Pt or these alloys are available for them.

Device Operation

The general operation of the surface-emitting light-emitting device 100 of the present embodiment will be described hereafter. Here, the following operating method is one of examples and other changes in form and details may be made therein without departing from the spirit and scope of the invention.

Firstly, the voltage of the forward direction is applied to PIN diode via the first electrode 107 and the second electrode 109. Thus, recombination of electrons and holes is occurred and light is generated thereby within the active layer 130. Stimulated emission is occurred, when light generated as above-mentioned goes back and forth between the upper mirror 104 and the lower mirror 102 so that the light intensity is amplified. Then, laser oscillation is occurred if the light gain exceeds the light loss. A laser light is emitted toward the vertical direction with reference to the semiconductor substrate 1 (Z direction shown in FIG. 1) from the emitting surface 108 on the upper surface of the columnar portion 130. Here, "the vertical direction with reference to the semiconductor substrate 1" means the vertical direction (Z direction shown in FIG. 1) with reference to the surface 101*a* (a surface in parallel with X-Y surface in FIG. 1) of the semiconductor substrate 1.

Manufacturing Process of the Device

Next, an example of a process for manufacturing the surface-emitting light-emitting device 100 according to the first embodiment of the present invention will be described with referring to figures from FIG. 3 to FIG. 9. FIG. 3 to FIG. 9 show schematically cross sectional views for a process of manufacturing the surface-emitting light-emitting device 100 of the embodiment shown in FIG. 1 and FIG. 2. These are corresponding to cross sectional view shown in FIG. 1 respectively.

Figure 3:
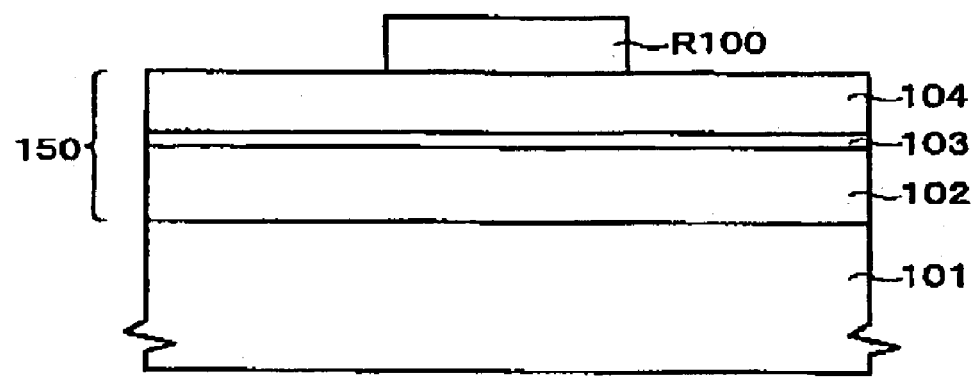
FIG. 3 is a cross sectional view schematically showing one of processes of manufacturing the surface-emitting light-emitting device according to the first embodiment of the present invention.

(1) Firstly, a multi-layers semiconductor film 150, as shown in FIG. 3 is formed with epitaxial growth while modulating the component ratio on the surface of the semiconductor substrate 101 composed of n-type GaAs. Here, the multi-layers semiconductor film 150 comprises a structure including the following layers: for example, the distributed reflective-type multi-layer mirror 102 (a lower mirror hereunder) composed of 40 pairs of a multi-layers of a n-type $Al_{0.9}Ga_{0.1}As$ layer and a n-type $Al_{0.15}Ga_{0.85}As$ layer which are accumulated alternatively, the active layer 103 composed of a GaAs well layer and a $Al_{0.3}Ga_{0.7}As$ barrier layer and includes a quantum well structure having triple well layers, and the distributed reflective-type multi-layer mirror 104 (an upper mirror hereunder) composed of 25 pairs of a multi-layers of a p-type $Al_{0.9}Ga_{0.1}As$ layer and a p-type $Al_{0.15}Ga_{0.85}As$ layer which are accumulated alternatively. Namely, the multi-layers semiconductor film 150 is formed by accumulating these layers in order on the semiconductor substrate 101. Here, when the upper mirror 104 is formed, at least one layer adjacent to the active layer is formed as an AlAs layer or an AlGaAs layer where Al is more than 90%. This layer comes to be the electric current constriction layer 105 by oxidizing it later. Further, it is preferable that carrier density should be enhanced in the most upper surface of the upper mirror so as to have better ohmic contact with the electrode (the first electrode 107 described hereafter).

Appropriate temperature for epitaxial growth is determined by a method of growing, materials, a kind of the semiconductor substrate, a kind of the multi-layers semiconductor film 150, its thickness and carrier density. But, it is preferable that it is generally in the range from 450° C. to 800° C. Further, time for epitaxial growth is also determined appropriately as well as temperature. As a method of epitaxial growth, there are metal-organic vapor phase epitaxy (MOV), molecular beam epitaxy (MBE) and liquid phase epitaxy (LPE).

Figure 4:
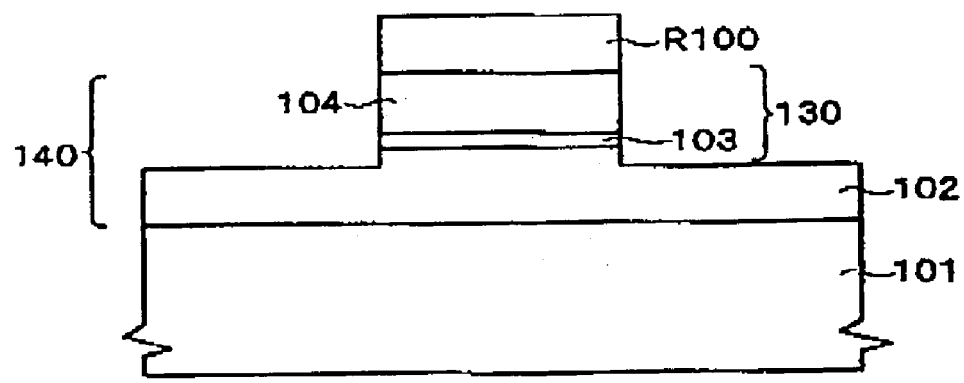
FIG. 4 is a cross sectional view schematically shoving one of processes of manufacturing the surface-emitting light-emitting device shown in FIG. 1 and FIG. 2.

Further, a resist layer R100 having a given pattern is successively formed on the multi-layers semiconductor film 150 by patterning a photo resist layer via a photo lithographic method after coating a photo resist layer (not shown in figure). Then, the upper mirror 104, the active layer 103 and a part of the lower mirror 102 are etched by a dry etching method, for example, while being the resist layer R100 as a mask so that the pillar-type semiconductor accumulation (the columnar portion) 130 is formed as shown in FIG. 4. According to these manufacturing processes, the resonator 140 including the columnar portion 130 can be formed on the semiconductor substrate 101, which is shown in FIG. 4. The resist layer R100 is removed thereafter.

Figure 5:
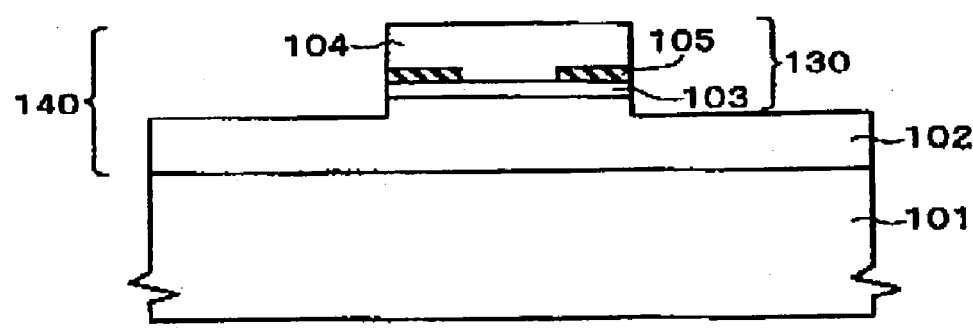
FIG. 5 is a cross sectional view schematically showing one of processes of manufacturing the surface-emitting light-emitting device shown in FIG. 1 and FIG. 2.

Further, the semiconductor substrate 101 with the resonator 140 formed by the above mentioned processes is put into the steam atmosphere of 400° C., for example, so that the side of a layer composed of high density Al of the above mentioned upper mirror 104 is oxidized. Thus, as shown in FIG. 5, the electric current constriction layer 105 is formed. The oxidizing rate depends on temperature of the furnace, amount of supplied water, concentration and thickness of Al (at the above mentioned layer of high concentration of Al). In the surface emitting-type laser that is provided with the electric current constriction layer formed by oxidization, electric current is flown only in the area where the electric current constriction layer is not formed (non oxidized area) when the laser is activated. Hence, it is possible to control the current density by managing the range of the electric current constriction layer under the process of forming it by oxidization.

Under the above-mentioned process, a portion which works as a light-emitting element (except the emitting surface 108 and electrodes 107 and 109) in the surface-emitting light-emitting device 100 is formed.

Figure 6:
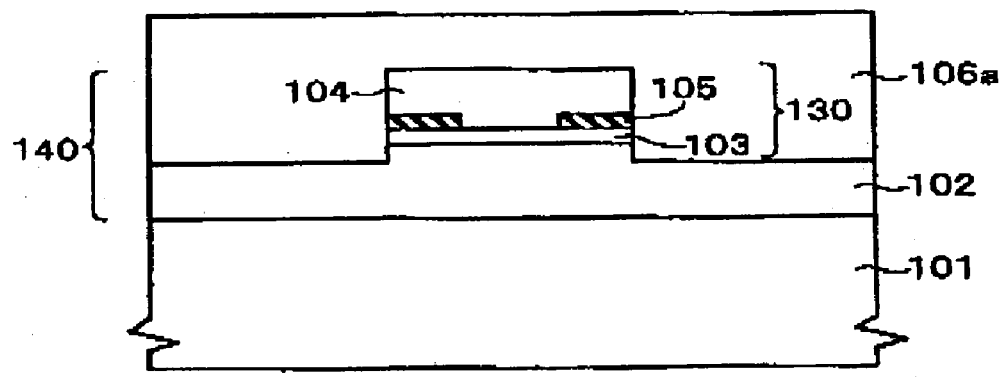
FIG. 6 is a cross sectional view schematically shoving one of processes of manufacturing the surface-emitting light-emitting device shown in FIG. 1 and FIG. 2.

(2) Secondary, the insulating layer 106 surrounding the columnar portion 130 (see FIG. 9) is formed. Here, it will be described the case when polyimide resin is used as a material for forming the insulating layer 106. As the first step, as shown in FIG. 6, a precursor (polyimide precursor) is coated on the resonator 104 to form a resin-precursor layer 106a. Here, the resin-precursor layer 106a is formed so that the thickness of the resin-precursor layer 106a (Namely, the distance from the upper surface of the resin-precursor layer 106a to the upper surface of the lower mirror 102) is higher than the height of the columnar portion 130. Next, if the resin-precursor layer 106a includes a solvent, this solvent within the resin-precursor layer 106a is removed by heating the semiconductor substrate 101 via a hot plate or others. Further, the resin existing on the columnar portion 130 is removed.

Here, as a method of forming the resin-precursor layer 106a, a dipping method, a spray coating method and ink jet method which are well known, can also be used more than the above mentioned spin coating method.

As a method of removing the resin existing on the columnar portion 130, it is exemplified that (i) the resin existing on the columnar portion 130 is removed by wet etching after half-curing the resin-precursor layer 106a (this method is disclosed in the patent application number 2001-0666299), or (ii) the resin existing on the columnar portion 130 is removed by dry etching after full-curing the resin-precursor layer 106a. In this embodiment, the case of using a method of using the above (i) will be described.

In the method of the above (i), the resin-precursor layer 106a is hardened by half to form the half-cured resin layer 106b. Here, half-cured is defined as what solubility to an etchant used for consequent process of wet etching is changed by irradiating energy rays such as heat or light.

Figure 7:
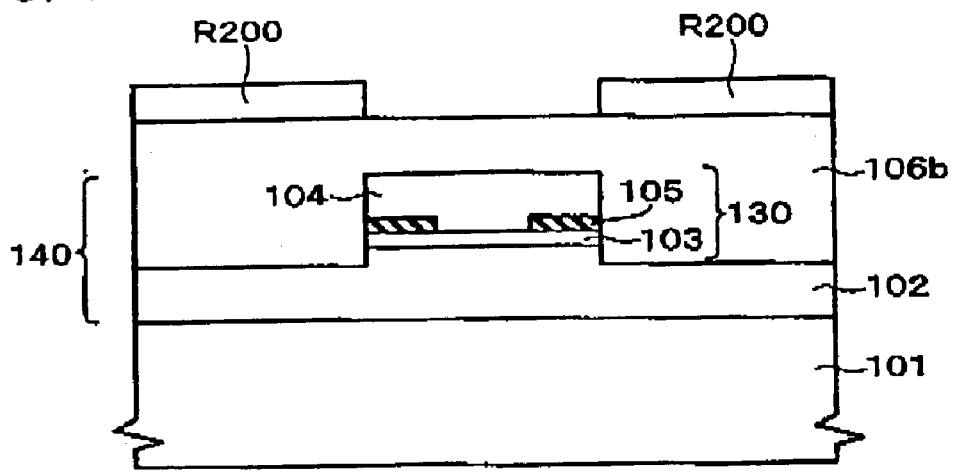
FIG. 7 is a cross sectional view schematically showing one of processes of manufacturing the surface-emitting light-emitting device shown in FIG. 1 and FIG. 2.

Next, as shown in FIG. 7, a resist layer R200 is coated on half-cured resin layer 106b so that the resist layer R200 is formed in an area where the columnar portion 130 is not formed near under, but not formed in another area where the columnar portion 130 is formed near under by a photolithographic method.

Figure 8:
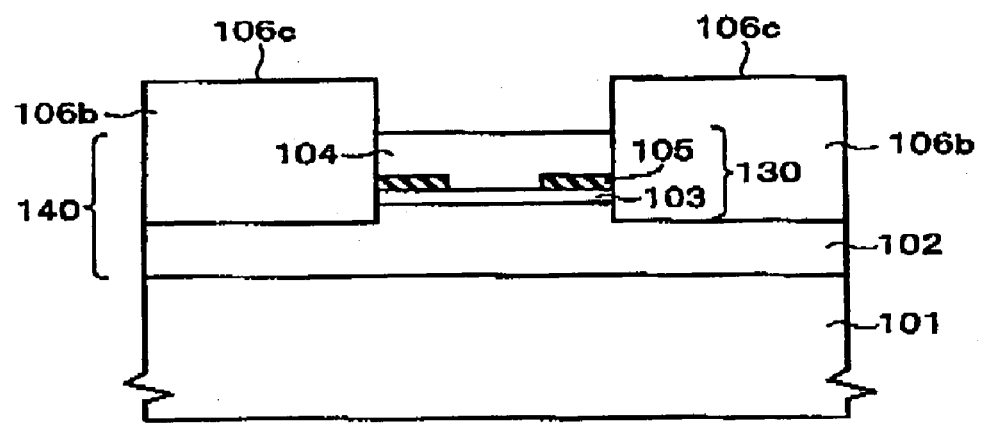
FIG. 8 is a cross sectional view schematically showing one of processes of manufacturing the surface-emitting light-emitting device shown in FIG. 1 and FIG. 2.

Further, as shown in FIG. 8, the half-cured resin layer 106b, which has been formed on the columnar portion 130, is removed by processing the semiconductor substrate 101 via wet etching. Then, the resist layer R200 is removed thereafter.

Figure 9:
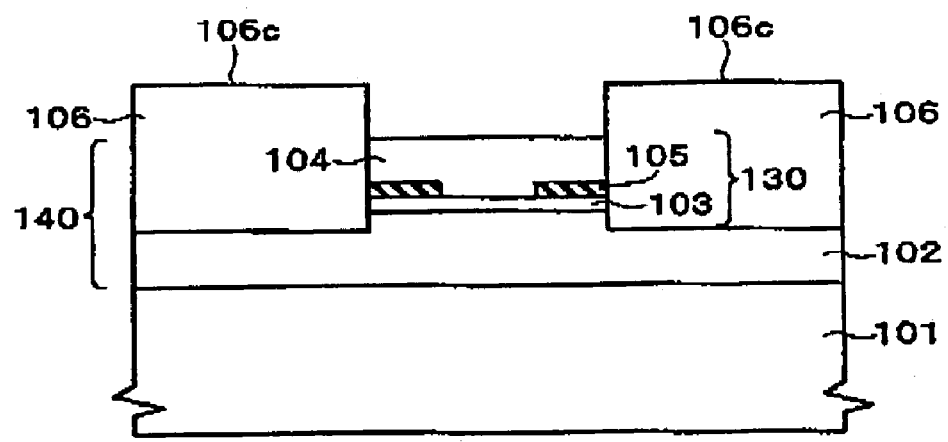
FIG. 9 is a cross sectional view schematically showing one of processes of manufacturing the surface-emitting light-emitting device shown in FIG. 1 and FIG. 2.

The semiconductor substrate 101 is successively put in the furnace of 350° C., for example, to change the half-cured resin layer 106b to be imide. Thus, the full-curing insulating layer 106 can be obtained thereby, as shown in FIG. 9. The height of the insulating layer 106 (see FIG. 9) can be controlled by managing the thickness of the resin-precursor layer 106a (see FIG. 6). Thus, the height of the bank 110 (see FIG. 1) can be controlled thereby.

Further, in the above (i) method, it is possible to implement direct pattering such as a method of general resist pattering without forming a resist layer on a resin precursor (not exposed to light) when the insulating layer 106 is formed with a photosensitive resin.

Here, in the above-mentioned explanation, the above method (i) was illustrated. However, the method of removing resin existing on the columnar portion 130 is not limited to this method, but expanded to the above method (ii).

Under this process, the upper surface 106c of the insulating layer 106 is formed on the position that is higher than the upper surface of the columnar portion 130, as shown in FIG. 9.

(3) Next, a process for forming the first electrode 107 and the second electrode 109 for injecting electric current into the active layer 103 and the emitting surface of a laser 108 will be described.

As the first step, the columnar portion 130 is cleansed by a plasma process method, if it is necessary, before forming the first electrode 107 and the second electrode 109. This cleansing gives stabilized characteristics to a device. Next, the accumulated layers of an alloy of Au and Zn and Au, for example, (not shown in a figure) are formed on the insulating layer 106 and the columnar portion 130 by vacuum evaporation, for example. Then, a portion having no accumulated layers is formed on the upper surface of the columnar portion 130 by a lift-off method. This portion comes to be the emitting surface 108. Here, a dry etching method can also be used instead of a lift-off method.

Further, the accumulated layers of an alloy of Au and Ge and Au, for example, (not shown in a figure) are formed on a lower surface of the semiconductor substrate 101 by vacuum evaporation, for example. Then, these are annealed. The temperature of this annealing depends on a material for an electrode. In a case of such material of the present embodiment, these are generally annealed around 400° C. Under this process, the bank 110 is formed as well as forming the first electrode 107 and the second electrode 108. The bank 110 comprises the insulating layer 106 and a portion where a part of the first electrode 107 is formed on the upper surface of the insulating layer 106. In this case, the first electrode 107 can be formed on the insulating layer 106 without specific treatment in the above-mentioned process, since a part of the bank 110 is composed of the insulating layer 106. The upper edged portion 110a of the bank 110 is located on the position that is higher than that of the emitting surface 108.

The surface-emitting light-emitting device 100 as shown in FIG. 1, can be obtained under the above-mentioned process.

Functions and Effects

Major functions and effects of the surface-emitting light-emitting device 100 according to the present embodiment will be described hereafter.

(1) According to the surface-emitting light-emitting device 100 of the present embodiment, an optical member can be installed stably within an area inside the bank 110 since it includes the emitting surface 108 and the bank 110 surrounding the emitting surface 108 and the upper edged portion 110a of the bank 110 is located on the position which is higher than that of the emitting surface 108. Hence, optical characteristics of light emitted from the emitting surface 108 can be effectively controlled.

(2) Further, according to a method of manufacturing the surface-emitting light-emitting device 100 of the present embodiment, the light-emitting element of which optical characteristics can be effectively managed, can be formed by a simple method.

Further, according to the present embodiment, it was described the case when the surface-emitting light-emitting device 100 is a surface emitting-type laser diode. On the other hand, the present invention can be applied to other surface-emitting light-emitting devices. For example, an EL element and a semiconductor light-emitting diode can be considered as the surface-emitting light-emitting device where the present invention can be applied.

Second Embodiment

Device Structure

Figure 10:
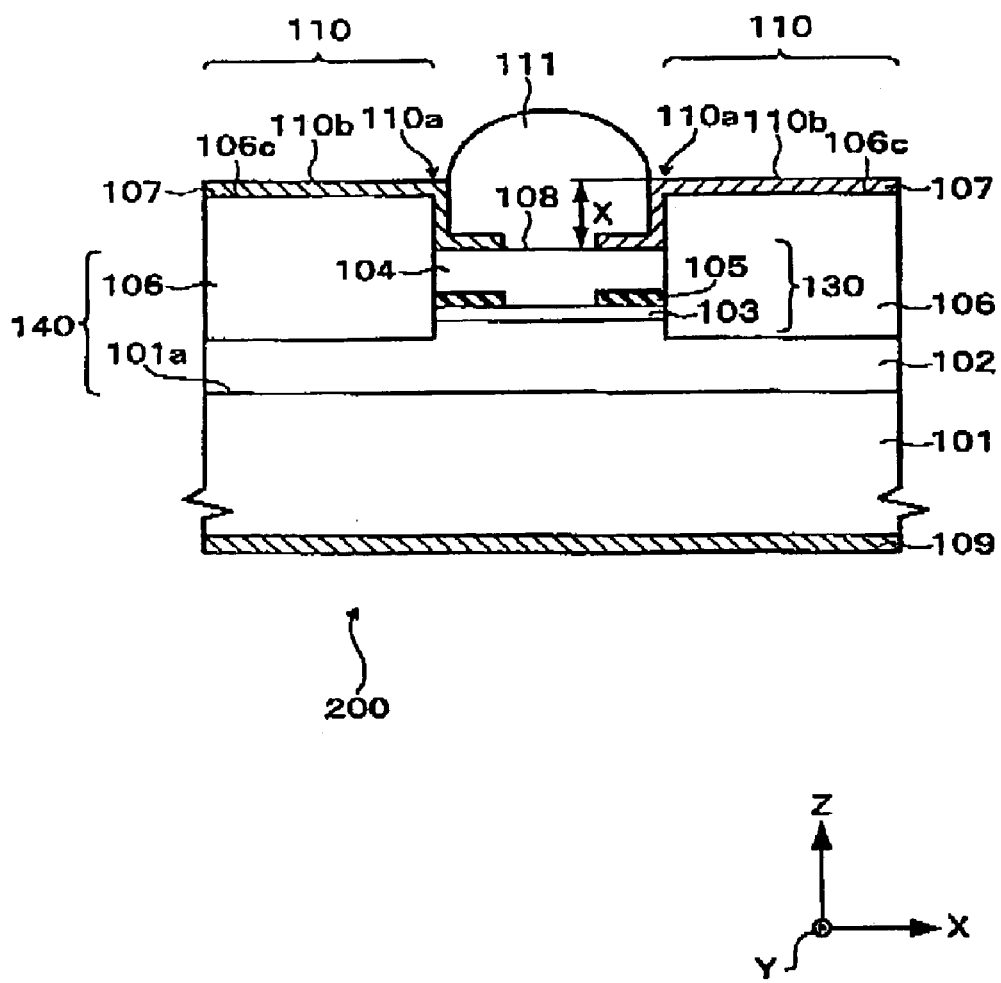
FIG. 10 is a cross sectional view schematically showing the surface-emitting light-emitting device according to the second embodiment of the present invention.
Figure 11:
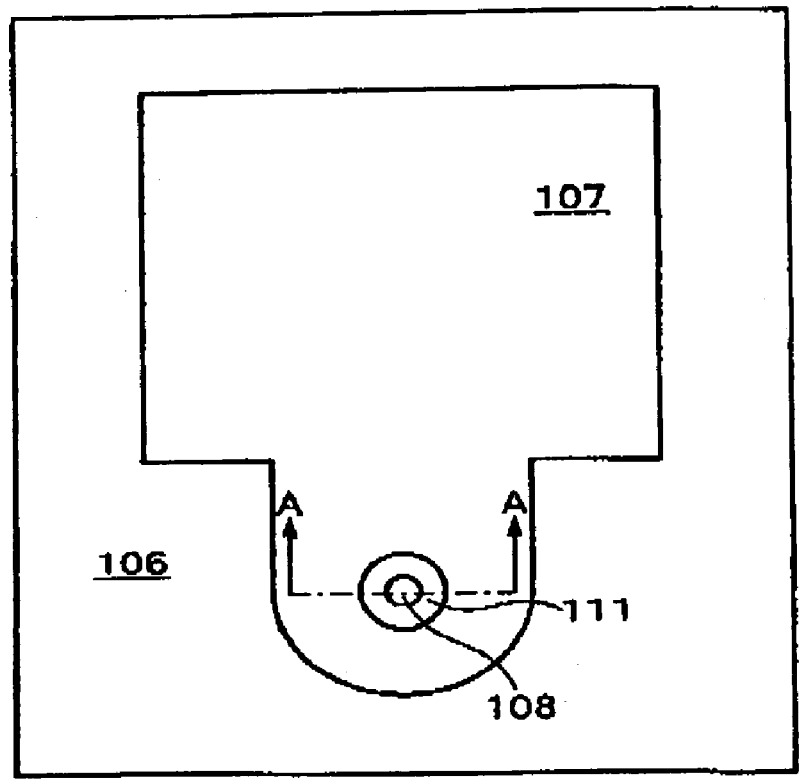
FIG. 11 is a plain view schematically showing the surface-emitting light-emitting device according to the second embodiment of the present invention.
Figure 11:
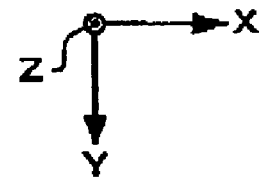

FIG. 10 is a cross sectional view schematically showing a surface-emitting light-emitting device 200 according to the second embodiment of the present invention. FIG. 2 is a plain view schematically showing the surface-emitting light-emitting device 200 according to the second embodiment of the present invention. FIG. 10 is a cross sectional view taken along a line A—A line shown in FIG. 11. Here, in the present embodiment, it will be described the case when a surface emitting-type laser diode is used as a surface-emitting light-emitting device as well as the first embodiment.

The surface-emitting light-emitting device 200 according to the present embodiment includes the almost same structure of the surface-emitting light-emitting device 100 except that a lens 111 as an optical member is installed on the emitting surface 108. The same reference numbers used in the surface-emitting light-emitting device 100 are applied to the structural elements working as the same function substantially and details of them are omitted.

The lens 111 is formed on the emitting surface 108 in an area inside the bank 110. A material of the lens 111 is not specifically limited. However, it is formed by using a material such as a precursor of ultraviolet-cured resin or thermal curing resin, which is cured by heat or light energy. Such material is one of, for example, an ultraviolet-cured polyimide resin, an ultraviolet-cured acryl resin and an ultraviolet-cured epoxy resin.

Here, it is described the case when the lens 11 is used as an optical member in the present embodiment. On the other hand, an optical member is not limited to a lens, but any one of an interference filter, a wavelength filter, a polarizing filer and a wavelength conversion member. If the optical member is a wavelength filter, the optical member can pass light composed of specific a wavelength. Further, If the optical member is a wavelength conversion member, the optical member can emit light of which wavelength is different from that of light emitted from the emitting element 200.

Device Operation

The operation of the surface-emitting light-emitting device 200 according to the present embodiment is the almost same of that of the surface-emitting light-emitting device 100. But, according to the surface-emitting light-emitting device 200 of the present embodiment, light is emitted from the emitting surface 108 toward the direction perpendicular to the semiconductor substrate 101 (Z-direction shown in FIG. 10) after that its radiation angle is adjusted by the lens 111 since the lens 111 is installed on the emitting surface 108.

Manufacturing Process of the Device

Figure 12:
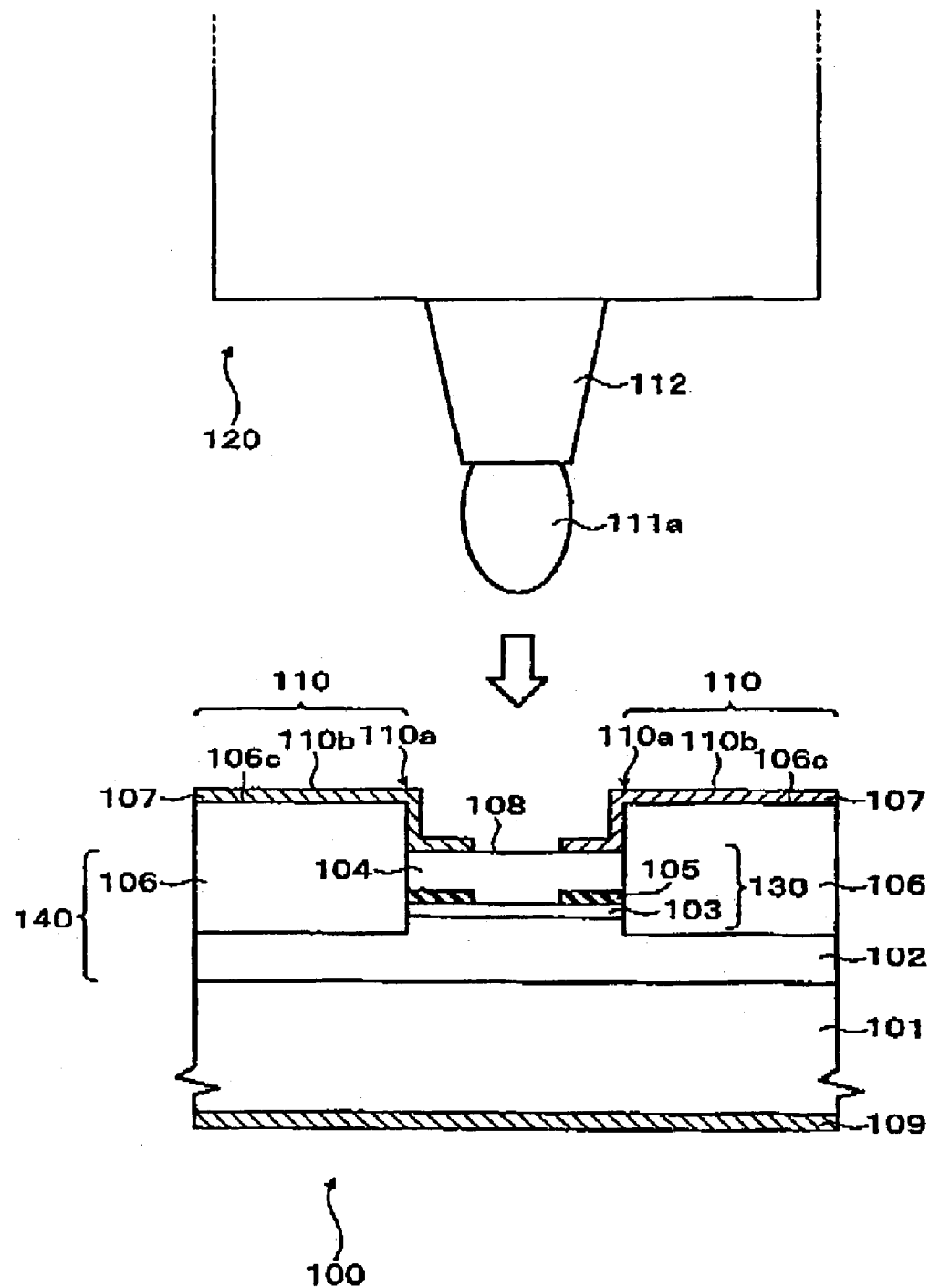
FIG. 12 is a cross sectional view schematically showing one of processes of manufacturing the surface-emitting light-emitting device shown in FIG. 10 and FIG. 11.
Figure 13:
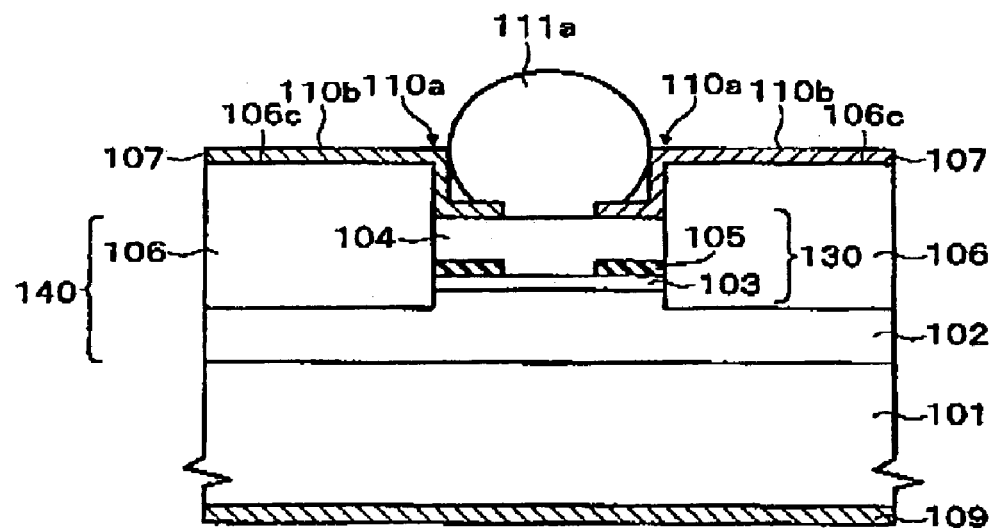
FIG. 13 is a cross sectional view schematically showing one of processes of manufacturing the surface-emitting light-emitting device shown in FIG. 10 and FIG. 11.
Figure 14:
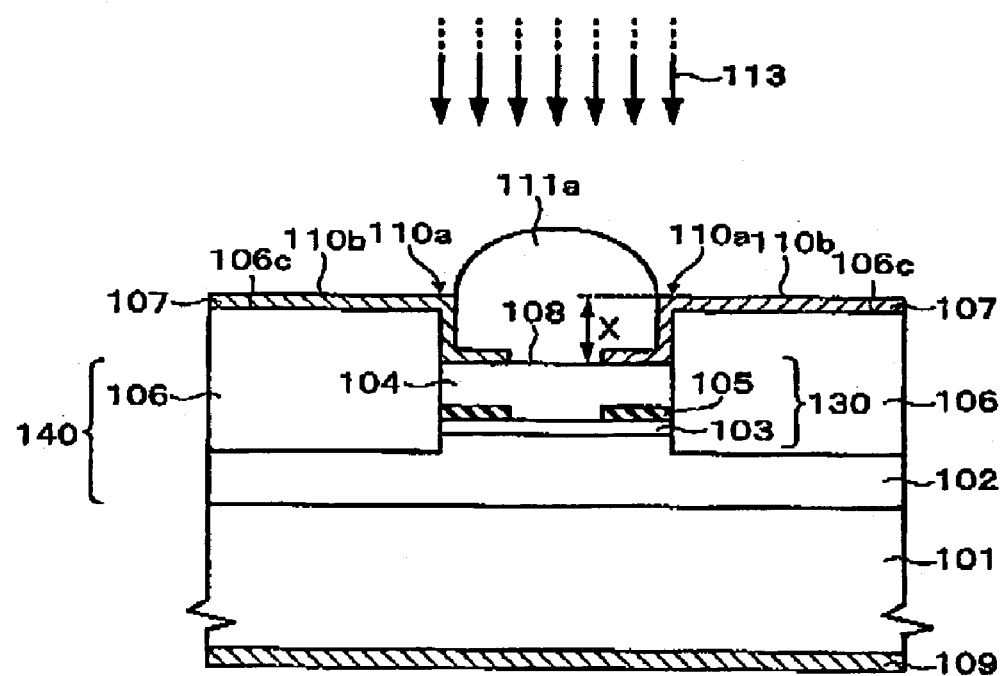
FIG. 14 is a cross sectional view schematically showing one of processes of manufacturing the surface-emitting light-emitting device shown in FIG. 10 and FIG. 11.

Next, an example of a process for manufacturing the surface-emitting light-emitting device 100 of the first embodiment of the present invention will be described with referring to figures from FIG. 12 to FIG. 14. FIG. 12 to FIG. 14 show schematically cross sectional views illustrating processes for manufacturing the surface-emitting light-emitting device 100 of the embodiment shown in FIG. 10 and FIG. 11. These are corresponding to cross sectional view shown in FIG. 10 respectively.

A surface-emitting light-emitting device 200 according to the second embodiment is obtained by forming the lens 111 on the emitting surface 108. Hence, as the first step, the surface-emitting light-emitting device 100 is formed by the above-mentioned process to form the surface-emitting light-emitting device 200. Here, in the present embodiment, it is described the case when an ultraviolet-cured resin is used as a material for forming the lens 111 (a lens material 111a). But, the material for manufacturing the lens is not limited to it. Ultraviolet-cured resin is hardened by irradiating ultraviolet in short time. Namely, it can be hardened without a process such as thermal process which may give damage to an element. Hence, influence of it to an element can be minimized since the lens 111 is formed by using a lens material 111a of ultraviolet-cured resin.

Next, a process of adjusting wetting angle of the lens material 111a (see FIG. 12) is implemented, if it is necessary, before forming the lens 111 (see FIG. 10). As a method of adjusting wetting angle, (i) a method for forming a thin film with a material composed of volatilization to a lens material (ii) a method of changing surface quality by plasma processing can be exemplified. The size and the shape of the lens can be precisely controlled by ejecting a lens material after completing the above process. In the present embodiment, it will be described the case when the above method (i) is used. Further, it will also be described the case when alkyl silane fluoride (FAS) is used as a material composed of volatilization to a lens material.

As the first step, the surface-emitting light-emitting device 100 is put into the vapor atmosphere of FAS so that a layer of adjusting the wetting angle composed of FAS (not shown in a figure) film is formed on all of the surface of the element 100. A single molecular film of FAS is formed at least in an area inside the bank 110 by the above process. According to this process, a desirable shape of the lens 111 can be obtained by a layer of adjusting the wetting angle composed of FAS and the wetting angle of the lens material 111a, when the lens material 111a is introduced in an area inside the bank 110 by a process mentioned hereafter. Especially, if a wetting angle between a layer of adjusting the wetting angle composed of a FAS single molecular film and the lens material 111a is large, a lens composed of a small curvature radius can be obtained effectively.

Next, the lens material 111a is introduced into the region inside of the bank 110. In the present embodiment, it will be described a case when the lens material 111a is ejected to the region inside of the bank 110 by using ink jet method. As a method of ink jet ejection, (i) a method of ejecting a liquid with a pressure caused by changing the size of air bubble in a liquid (here a lens material) with heating, or (ii) a method of ejecting a liquid with a pressure caused by a piezo element is considered. Here, the method of the above (ii) is preferable viewed from pressure control.

The position of a nozzle of an ink jet head is aligned with the position of ejecting a lens material by a well-known image recognition technology, which is used in an exposure process or an examination process in a general process for manufacturing a semiconductor integrated circuit. For example, as shown in FIG. 12, the position of the nozzle 112 of the ink jet head 120 is aligned with the position of the bank 110 of the surface-emitting light-emitting device 100. Voltage applied to the ink jet head 120 is controlled after the above alignment. Then, the lens material 111a is ejected thereafter. In this case, as shown in FIG. 13, if the lens material 111a ejected from the nozzle 112 is impacted in the region inside of the bank 110, the position is automatically corrected since the shape of the lens material 111a is transformed in order that the center of the region surrounded by the bank 110 with surface tension is aligned with the center of the lens material 111a. In this case, the shape of the les material 111a has a volume of the region inside of the bank 110, an amount of ejecting the les material 111a and a curvature corresponding to the contact angle of the lens 111a. Hence, it is possible to control the curvature radius of the lens 111 so as to improve easiness in designing.

After completing the above-mentioned process, the lens 111 composed of a perpetual shape is formed on the emitting surface 108, as shown in FIG. 14, by curing a resin with irradiating energy rays 113 (such as ultraviolet). An appropriate a wavelength of ultraviolet rays and an amount of its irradiation depend on the lens material 111a. For example, when an acrylic ultraviolet-cured resin is used as the lens material 111a, it can be cured by irradiating it with ultraviolet rays of which wavelength is 350 nm and intensity is 10 mW for five minutes. Hence, the surface-emitting light-emitting device 200 is formed under the above-mentioned process.

Here, in the above-mentioned process, it was described the case when FAS is used as a material composed of volatilization to a lens material at the time of adjusting wetting angle of the lens material 111a (see FIG. 12). On the other hand, a fluoride resin can also be used instead of PAS. In this case, the region except the inside of the bank 110 is covered by a resist layer. Then, a layer of adjusting wetting angle (not shown) made of a fluoride resin is formed by a method such as spinning coating. Thus, a desirable shape of a lens can be obtained precisely by forming the layer of adjusting wetting angle as well as a method of using FAS described above. Further, the lens can be precisely formed in the region inside of the bank 111 and the size and the shape of the lens 111 can be controlled in detail.

Functions and Effects

The surface-emitting light-emitting device 200 and the manufacturing method thereof according to the present embodiment has the substantial same functions and effects of the surface-emitting light-emitting device 100 and the manufacturing method thereof according to the first embodiment. Further, the surface-emitting light-emitting device 200 and the manufacturing method thereof according to the present embodiment has the following additional functions and effects.

(1) According to the surface-emitting light-emitting device 200, recombination effectiveness of light emitted from the emitting surface 108 can be improved when such light is introduced into an optical wave guide such as an optical fiber since the lens 111 is formed in an area inside the bank 110.

Further, in the surface-emitting light-emitting device 200, the upper edged portion 110a of the bank 110 is formed on the position that is higher than that of the emitting surface 108 and the lens 111 is installed in the region inside of the bank 110 so that the lens 111 is precisely located at a given position. Then, radiation angle can be accurately controlled.

Further, the upper edged portion 110a of the bank 110 is formed on the position which is higher than that of the emitting surface 108 by more than 0.5 µm so as to locate the lens 111 more stably.

Further, the upper surface 110b of the bank 110 is located at the position that is higher than that of the emitting surface 108. Thus, the lens can be located with further stability in the region inside of the bank 110.

(2) It is frequent to face difficulty in forming the lens precisely and simply by a general method of forming a lens on the emitting surface such as transferring process, for example. On the other hand, according to a method of manufacturing the surface-emitting light-emitting device 200 according to the present embodiment, it is easy to adjust an alignment and improve a yield when an optical member (the lens 111) is formed since the upper edged portion 110a of the bank 110 is formed on the position which is higher than that of the emitting surface 108.

Further, the upper edged portion 110a of the bank 110 is formed on the position which is higher than that of the emitting surface 108 by more than 0.5 µm so that it is easy to control an amount of introducing the lens material 111a in the region inside of the bank 110 when the lens material 111a (see FIG. 13) is introduced to form the lens 111a. Hence, it is possible to control the size and the shape of the lens 111.

Further, the lens 111 is formed by ejecting the lens material 111a into the region inside of the bank 110 via an ink jet method and curing the lens material 111a thereafter. Hence, it can be simple with high yield to form the surface-emitting light-emitting device under the above process.

Further, a desirable shape of the lens can be obtained accurately by the wetting angle between the layer of adjusting wet angel and the lens material 111a by adjusting the wetting angle of the lens material 111a (see FIG. 12), if it is necessary, before forming the lens 111 (see FIG. 10).

Third Embodiment

Device Structure

Figure 15:
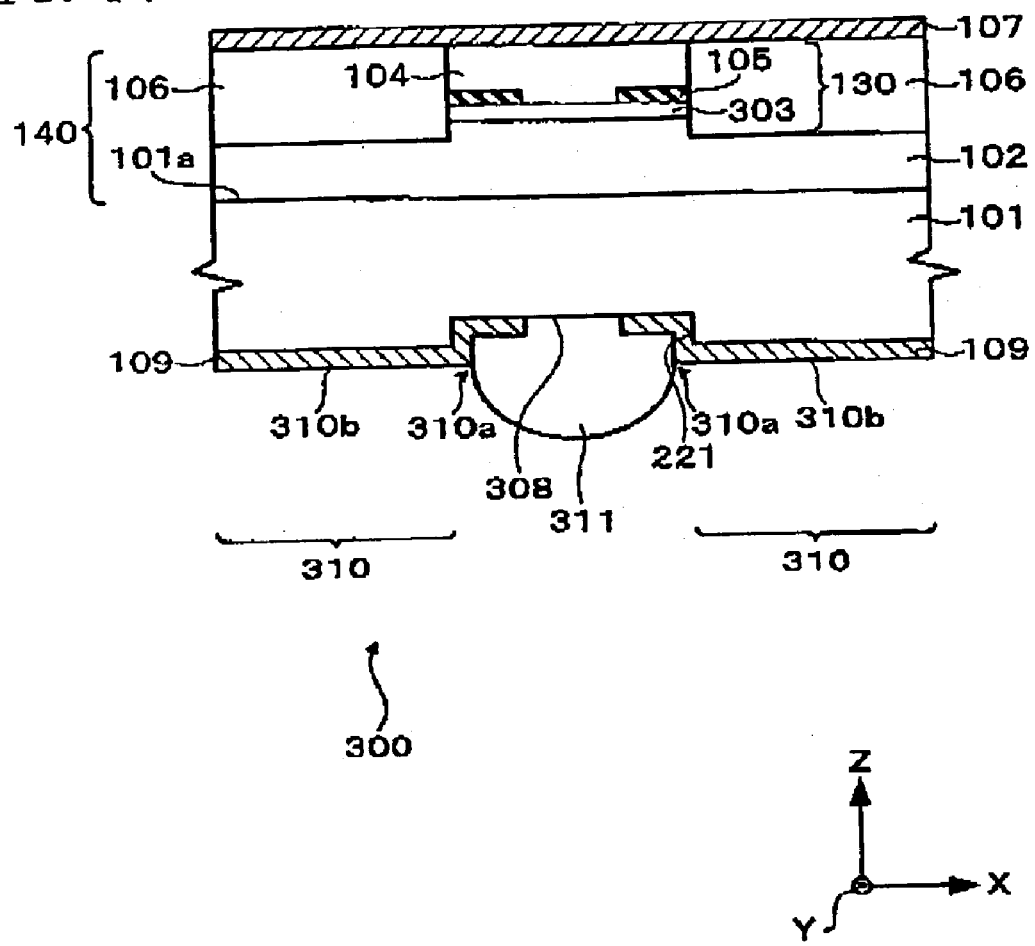
FIG. 15 is a plain view schematically showing the surface-emitting light-emitting device according to the third embodiment of the present invention.

FIG. 15 is a cross sectional view schematically showing a surface-emitting light-emitting device 300 according to the third embodiment of the present invention. Here, in the present embodiment, it will be described the case when a surface emitting-type laser diode is used as a surface-emitting light-emitting device as well as the first and the second embodiments.

The surface-emitting light-emitting device 300 according to the third embodiment has the structure where light is emitted from a lower surface of the semiconductor substrate 101. This is different from the structures of the surface-emitting light-emitting devices 100 and 200 of the first and the second embodiments. An emitting surface 308 is installed in the bottom surface of a recess 221 in the semiconductor substrate 101 in detail. Light is emitted from the emitting surface 308.

Further, in the surface-emitting light-emitting device 300, an active layer 303 including an InGaAs layer is formed. This is also different from the structures of the surface-emitting light-emitting devices 100 and 200 of the first and the second embodiments where an active layer 103 including an AlGaAs layer is formed. The active layer 303 maintains a quantum well structure including an $In_{0.3}Ga_{0.7}As$ well layer and a GaAs barrier layer.

Further, the surface-emitting light-emitting device 300 can work as the surface emitting-type light-emitting laser which emits light composed of its a wavelength; more than 880 nm (1100 nm, for example) to be transparent to a GaAs substrate since the active layer 303 including an InGaAs layer is installed.

On the other hand, this has the same structure of the surface-emitting light-emitting device 200 of the second embodiment viewed from a structure where the lens 311 is installed as an optical member.

This device has the substantial same of the surface-emitting light-emitting devices 100 and 200 of the first and the second embodiments except the above mentioned. The same reference numbers used in the surface-emitting light-emitting devices 100 and 200 are applied to the structural elements working as the same function substantially and details of them are omitted.

In the surface-emitting light-emitting device 300, the recess 221 is installed in a lower surface of the semiconductor substrate 101 and an emitting surface 308 is installed on the bottom surface of the recess 221. Further, the second electrode 109 is formed in the region outside of the emitting surface 308 of a lower surface of the semiconductor substrate 101. Namely, the emitting surface 308 is a portion that is not covered with the second electrode 109 within the bottom surface of the recess 221.

Further, a bank 310 is installed at a lower surface of the semiconductor substrate 101. The region, which is peripheral to the recess 221, works as the bank 310 in the surface-emitting light-emitting device 300. The peripheral region of the recess 221 of the semiconductor substrate 101 and the second electrode 109 formed on the peripheral region works as the bank 310.

Further, as shown in FIG. 15, an upper edged portion 310a of the bank 310 is formed on the position that is higher than that of the emitting surface 308. An upper surface 310b of the bank 310 is formed on the position that is higher than that of the emitting surface 308.

Device Operation

The operation of the surface-emitting light-emitting device 300 according to the present embodiment is the almost same of that of the surface-emitting light-emitting devices 100 and 200 of the first and second embodiments. But, in the surface-emitting light-emitting device 300, the emitting surface 308 is installed in a lower surface of the semiconductor substrate 101 so that light generated from the active layer 303 is emitted from the emitting surface 308 via the lower mirror 102 and the semiconductor substrate 101. Further, in the surface-emitting light-emitting device 300 according to the present embodiment, the lens 311 is installed on the emitting surface 308 as well as the surface-emitting light-emitting device 200 according to the second embodiment. Hence, light is emitted from the emitting surface 308 toward the direction perpendicular to the semiconductor substrate 101 (the Z-direction shown in FIG. 15) after adjusting its radiation angle by the lens 311.

Manufacturing Process of the Device

Figure 16:
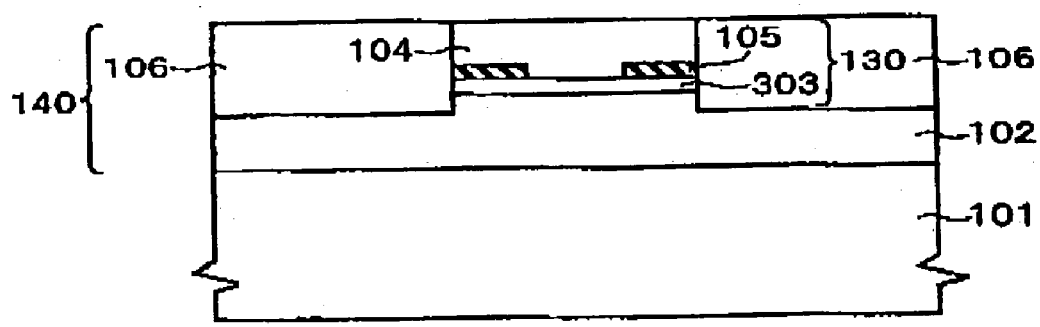
FIG. 16 is a cross sectional view schematically showing one of processes of manufacturing the surface-emitting light-emitting device shown in FIG. 15.
Figure 17:
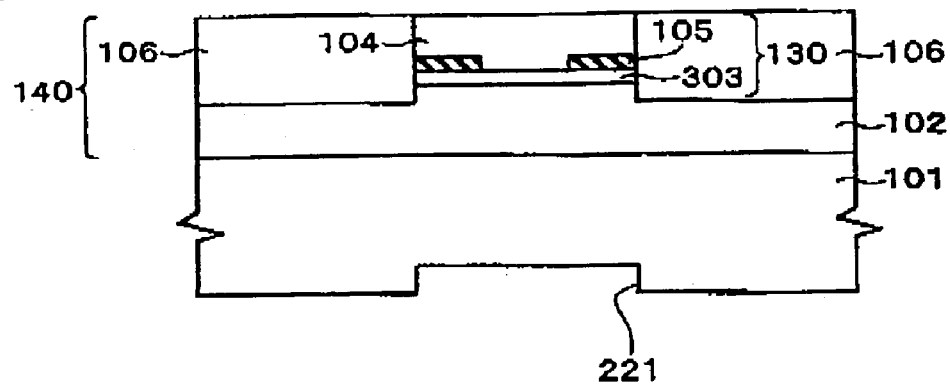
FIG. 17 is a cross sectional view schematically showing one of processes of manufacturing the surface-emitting light-emitting device shown in FIG. 15.

Next, an example of methods for manufacturing the surface-emitting light-emitting device 300 according to the third embodiment will be described with referring to FIG. 16 and FIG. 17. FIG. 16 and FIG. 17 are cross sectional views schematically showing a process of manufacturing the surface-emitting light-emitting device 300 according to the present embodiment.

The surface-emitting light-emitting device 300 according to the third embodiment can be manufactured part of the way by the same process for manufacturing the surface-emitting light-emitting device 100 according to the first embodiment. In detail, under a process for manufacturing the surface-emitting light-emitting device 100 according to the first embodiment, the device can be formed by using the semiconductor substrate 101 which was obtained via the almost same process shown in figures from FIG. 1 to FIG. 6 according to the first embodiment, except that the active layer 303 including an $In_{0.3}Ga_{0.7}As$ well layer and a GaAs barrier layer is formed instead of the active layer 103 (see FIG. 3).

Firstly, a half-cured resin layer (not shown) by half-cured the resin precursor layer 106a is formed on the semiconductor substrate 101 shown in pig. 6 by the same method described above, for example. Then, the height of the half-cured resin layer comes to be the same height of the upper surface of the columnar portion 130 by wet etching. The half-cured resin layer is fully hardened to form the insulating layer 106 (see FIG. 16) thereafter. Here, in this process, it is also permitted that the portion formed on the upper surface of the columnar portion 130 in a resin layer is removed by dry etching instead of wet etching, after forming the resin layer (not shown in figure) by full-cured the resin precursor layer 106a.

As shown in FIG. 17, the recess 221 is successively formed at a lower surface of the semiconductor substrate 101 by a dry etching method, for example. Then, the first electrode 107, the second electrode 109 and the emitting surface 308 are formed by the same method of manufacturing the surface-emitting light-emitting device 100 according to the first embodiment. The lens 311 is formed thereafter by the method of manufacturing the surface-emitting light-emitting device 200 according to the second embodiment.

Functions and Effects

The surface-emitting light-emitting device 300 and the manufacturing method thereof according to the present embodiment has the substantial same functions and effects of the surface-emitting light-emitting devices 100, 200 and these manufacturing method according to the first and the second embodiments. Further, the surface-emitting light-emitting device 300 and the manufacturing method thereof according to the present embodiment has the following additional functions and effects.

In this surface-emitting light-emitting device 300, the light path can be adjusted by adjusting the height of the bank 310, namely the depth of the recess 221. Thus, it is possible to control the radiation angle for emitting light with high degree of freedom. Hence, a device, where the radiation angle is preferably controlled, can be obtained. Further, an amount of lens material can be easily controlled by adjusting the depth of the recess 221. Consequently, the lens 311, of which size and shape are preferably controlled, can be formed.

Fourth Embodiment

Device Structure

Figure 18:
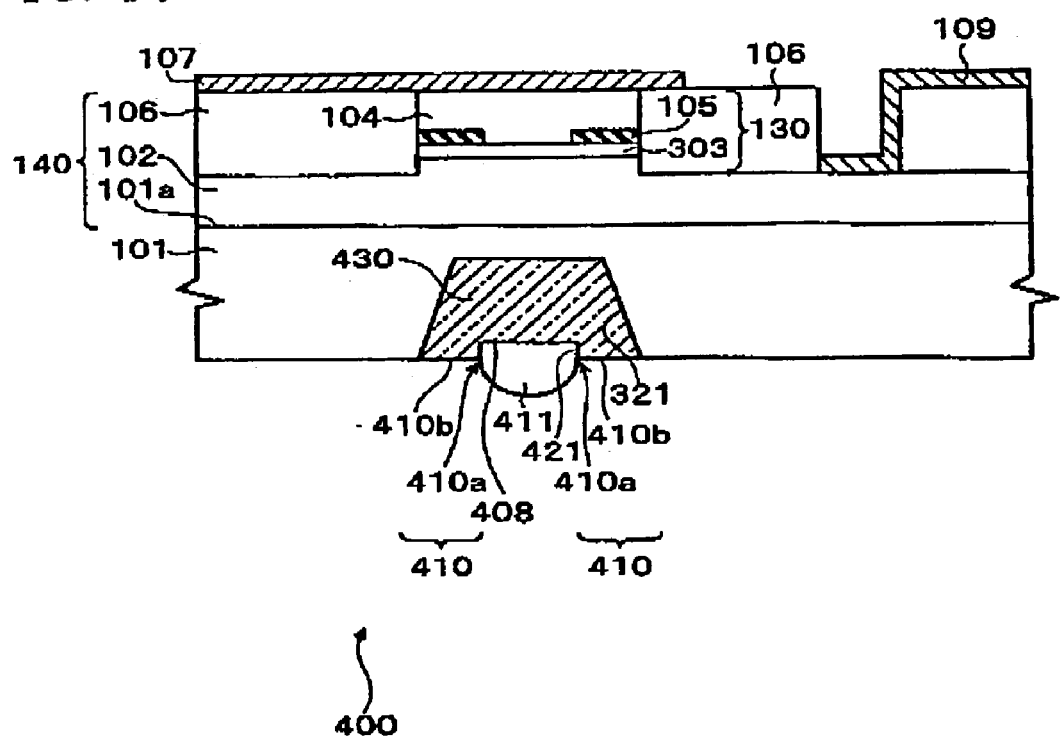
FIG. 18 is a cross sectional view schematically showing the surface-emitting light-emitting device according to the fourth embodiment of the present invention.
Figure 18:
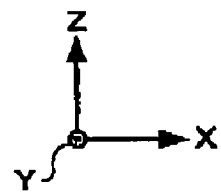

FIG. 18 is a cross sectional view schematically showing a surface-emitting light-emitting device 400 according to the fourth embodiment of the present invention. Here, in the present embodiment, it will be described the case when a surface emitting-type laser diode is used as a surface-emitting light-emitting device as well as the first to the third embodiments.

The surface-emitting light-emitting device 400 according to the present embodiment has the same structure of the surface-emitting light-emitting device 300 according to emitting light from a lower surface of the semiconductor substrate. Further, the surface-emitting light-emitting device 400 includes the active layer 303 composed of an $In_{0.3}Ga_{0.7}As$ well layer and a GaAs barrier layer as well as the surface-emitting light-emitting device 300.

On the other hand, the surface-emitting light-emitting device 400 has the structure which is different from that of the surface-emitting light-emitting device 300 according to points where a first recess 321 is installed on a lower surface of the semiconductor substrate 101, an layer 430 for adjusting the optical path in buried in the first recess 321 and the second electrode 109 is formed on the same side of the first electrode 107.

In the surface-emitting light-emitting device 400, the first recess 321 is installed on a lower surface of the semiconductor substrate 101, the layer 430 for adjusting the optical path is buried in the first recess 321 and a second recess 421 is installed in the layer 430 for adjusting the optical path, in detail. A lens 411 is formed as an optical member on the second recess 421.

This device has the substantial same structure and functions of the surface-emitting light-emitting device 400 except the above mentioned. The same reference numbers used in the surface-emitting light-emitting devices 100 and 200 are applied to the structure elements which have the same function substantially and details of them are omitted.

The layer 430 for adjusting the optical path is filled in the first recess 321. Namely, as shown in FIG. 18, the layer 430 for adjusting the optical path is formed between the semiconductor substrate 101 and the lens 411. The width and thickness of the layer 430 for adjusting the optical path is controlled by the width and depth of the recess 321. Further, it is preferable that the layer 430 for adjusting the optical path is made of a material, which has no range for absorbing a wavelength of a laser light emitted from the surface-emitting light-emitting device 400.

Further, the peripheral region of the second recess 421 works as the bank 410 in the surface-emitting light-emitting device 400. The upper edged portion 410a of the bank 410 is located at the position that is higher than that of the emitting surface 408. Further, the upper surface 410b of the bank 410 is also located at the position that is higher than that of the emitting surface 408.

Device Operation

The operation of the surface-emitting light-emitting device 400 according to the present embodiment is the almost same of that of the surface-emitting light-emitting devices 300 of the embodiments 3. But, in the surface-emitting light-emitting device 400, the layer 430 for adjusting the optical path is installed between the semiconductor substrate 101 and the lens 411 so that light generated from the active layer 303 goes through the lower mirror 102 and the semiconductor substrate 101, and reaches the emitting surface 408 via the layer 430 for adjusting the optical path from a lower surface of the semiconductor substrate 101. Then, this light is emitted from the emitting surface 408 thereby. Hence, light is emitted from the emitting surface 408 toward the direction perpendicular to the semiconductor substrate 101 (the Z-direction shown in FIG. 18) after adjusting its radiation angle by the lens 411.

Functions and Effects

The surface-emitting light-emitting device 400 and the manufacturing method thereof according to the present embodiment has the substantial same functions and effects of the surface-emitting light-emitting devices 100, 200 and 300 and these manufacturing method according to the first, the second and the third embodiments. Further, the surface-emitting light-emitting device 400 and the manufacturing method thereof according to the present embodiment has the following additional functions and effects.

According to the surface-emitting light-emitting device 400, it is possible to control the radiation angle of light with high degree of freedom since the layer 430 for adjusting the optical path is formed between the semiconductor substrate 101 and the lens 411. Namely, refractive index of the layer 430 for adjusting the optical path can be adjusted by selecting a material of the layer 430 for adjusting the optical path appropriately. Thus, it is possible to control the radiation angle of an emitted light with high degree of freedom.

Fifth Embodiment

Device Structure

Figure 19:
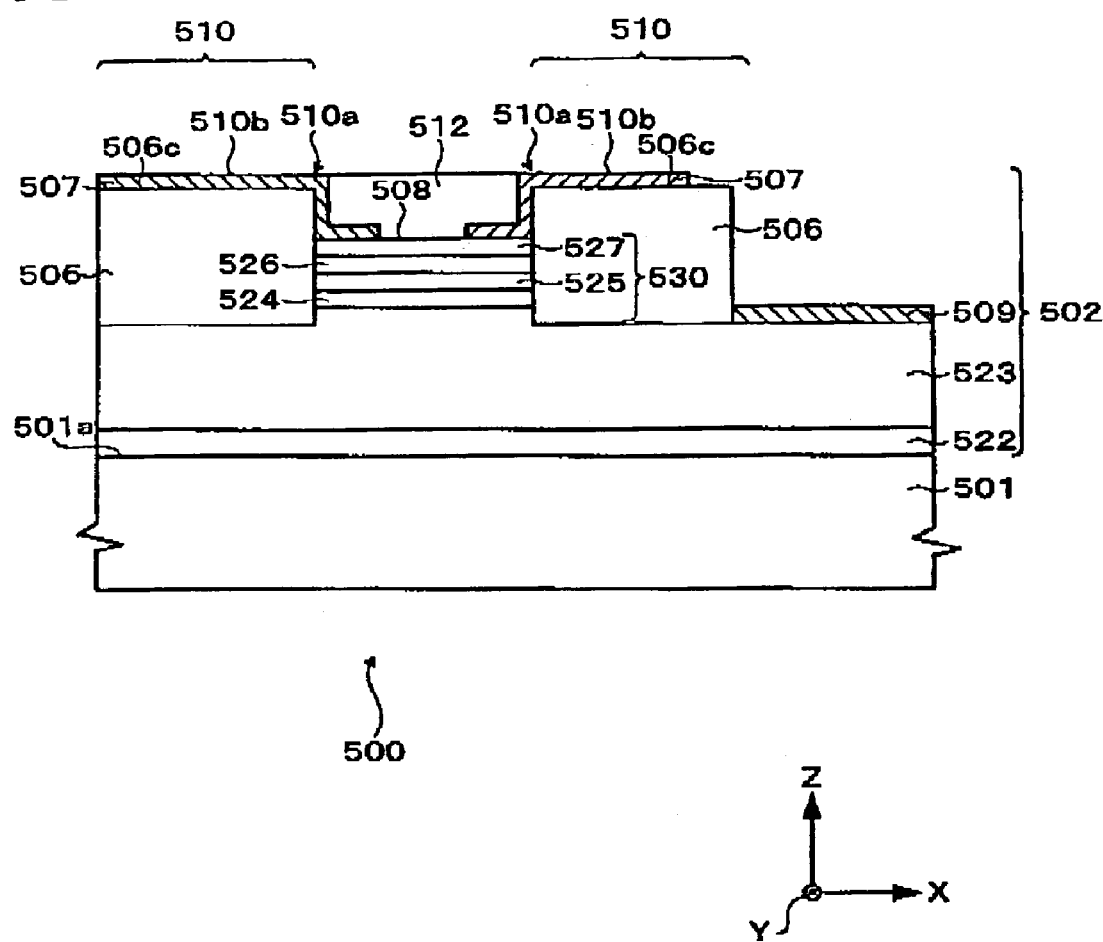
FIG. 19 is a cross sectional view schematically showing the surface-emitting light-emitting device according to the fifth embodiment of the present invention.
Figure 20:
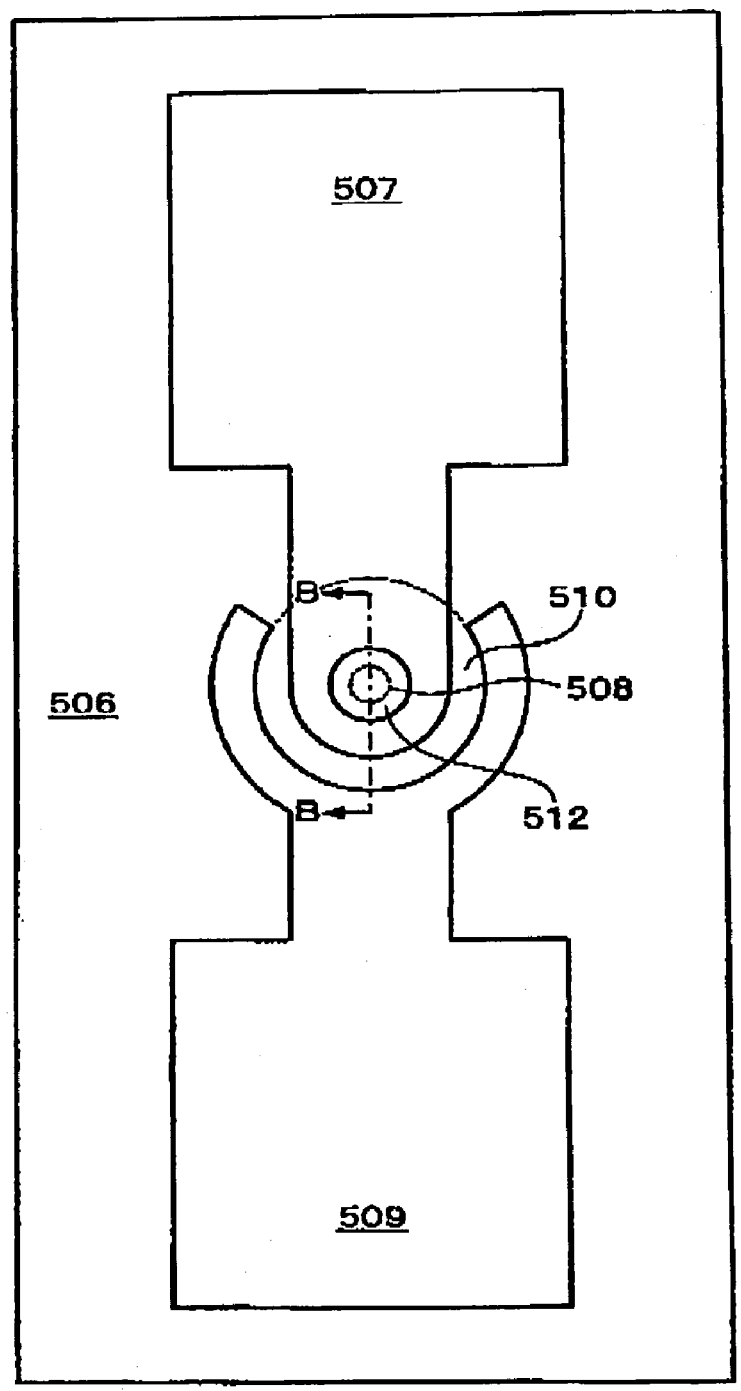
FIG. 20 is a plain view schematically showing the surface-emitting light-emitting device according to the fifth embodiment of the present invention.
Figure 20:
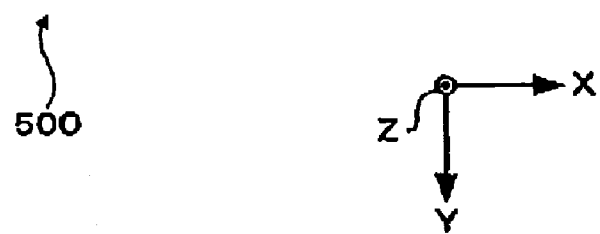

FIG. 19 is a cross sectional view schematically showing a surface-emitting light-emitting device 500 according to the fifth embodiment of the present invention. FIG. 20 is a plain view schematically showing the surface-emitting light-emitting device 500 according to the fifth embodiment of the present invention. FIG. 19 is a cross sectional view taken along a line B—B line shown in FIG. 20. Here, in the present embodiment, it will be described the case when a semiconductor ultraviolet emitting-type diode (ultraviolet LED hereafter) is used as a surface-emitting light-emitting device.

As shown in FIG. 19, the surface-emitting light-emitting device 500 includes a sapphire substrate 501 and light-emitting element 502 formed on the sapphire substrate 501. An ultraviolet light is emitted from the light-emitting element 502 in this surface-emitting light-emitting device 500.

The light-emitting element 502 includes, for example, a buffer layer 522 composed of a n-type GaN layer on the sapphire substrate 501, a contact layer 523 composed of a n-type GaN, a clad layer 524 composed of a p-type AlGaN layer, an active layer 525 including at least a GaN layer and working as light-emitting layer, a clad layer 526 composed of a p-type AlGaN layer and a contact layer 527 composed of a p-type GaN layer, which are accumulated in order.

A pin diode is formed by comprising a contact layer 523 composed of a n-type GaN, an active layer 525 without doped any impurities and the contact layer 527 composed of a p-type GaN layer.

Further, a portion from the light-emitting surface 508 of the light-emitting element 502 to the contact layer 523 on its way is etched as circular shape viewed from the direction facing to the light-emitting surface 508 and a columnar portion 530 is formed thereby. The columnar portion 530 is defined as a pillar-type semiconductor accumulation to be a part of the light-emitting element 502. Here, it is possible that the plane shape of the columnar portion 530 can be changed to one of any other shapes.

The insulating layer 506 covers over the side of the columnar portion 530 and the upper surface of the contact layer 523.

Further, a first electrode 507 is formed from the upper surface of the columnar portion 530 to the surface of the insulating layer 506. The emitting surface 508 is installed on the columnar portion 530 and light is emitted from the emitting surface 508. Namely, a portion where the first electrode 507 is not covered within the upper surface of the columnar portion 530 is the emitting surface 508. Further, the contact layer 523 is exposed by removing a part of the insulating layer 506 and a second electrode 509 is formed with contacting the surface of this exposed contact layer 523.

The insulating layer 506 and the first and the second insulating layers 507 and 509 are formed by using the same materials which were used for the first and the second electrodes 107, 109 and the insulating layer 106 in the surface-emitting light-emitting devices 100 to 400 of the first to fourth embodiments.

In this surface-emitting light-emitting device 500, the peripheral region of the columnar portion 530 works as the bank 510. Here, the peripheral region of the columnar portion 530 is defined as the insulating layer 506 and the region of the first electrode 507 that is formed on the upper surface 506c of the insulating layer 506.

Further, a fluorescent layer 512 is formed on the emitting surface 508. The fluorescent layer 512 is formed within the region inside of the bank 510, as shown in FIG. 19. This fluorescent layer 512 works as a wavelength conversion member. In detail, the fluorescent layer 512 works as the function where the wavelength of light generated from the light-emitting element 502 is changed to a different wavelength. The fluorescent layer 512 is made of a fluorescent material. The fluorescent material included in the fluorescent layer 512 is excited by light emitted from the emitting surface 508 and emits light of which wavelength depends on this fluorescent material thereby. The fluorescent layer 512 comprises a layer of a fluorescent material composed of an yttrium group and a europium group for example. In this case, the fluorescent layer 512 changes color of light which is generated from the light-emitting element 502 to red light. Here, the fluorescent material used for the fluorescent layer 512 is not limited to the above mentioned material, but a well known material of which main body is like Sr, Mg, Ba, Ca and Zn.

The bank 510 is formed with surrounding the emitting surface 508. The upper edged portion 510a of the bank 510 is located at the position that is higher than that of the emitting surface 508. Further, as shown in FIG. 19, the upper surface 510b can be located at the position that is higher than that of the emitting surface 508.

Device Operation

General operation of the surface-emitting light-emitting device 500 will be described as follows. Here, the following method of driving an ultraviolet LED is one of examples and other changes in form and details maybe made therein without departing from the spirit and scope of the invention.

Firstly, if forward voltage is applied to the pin diode by the first electrode 507 and the second electrode 509, recombination between electrons and holes is occurred within the active layer 525 and light (an ultraviolet light) is emitted by this recombination. This ultraviolet light is emitted from the emitting surface 508 on the upper surface of the columnar portion 530.

The fluorescent material in the fluorescent layer 512 is excited by ultraviolet light as exciting light emitted from the emitting surface 508 and light (red light here) of specific wavelength differing from that of ultraviolet light can be produced thereby. Hence, light of its wavelength depending on the material of the fluorescent layer 512 is emitted outside from the fluorescent layer 512.

Manufacturing Process of the Device

Next, an example of process for manufacturing the surface-emitting light-emitting device 500 of the fifth embodiment will be described. This surface-emitting light-emitting device 500 can be formed by the same process for manufacturing the surface-emitting light-emitting device 100 of the first embodiment.

(1) Firstly, the multilayers (not shown in the figure) are grown and crystallized on the surface of the sapphire substrate 501. These layers are; the buffer layer 522 composed of a n-type GaN layer on the sapphire substrate 501, the contact layer 523 composed of a n-type GaN, the clad layer 524 composed of a p-type AlGaN layer, the active layer 525 including at least a GaN layer and working as light-emitting layer and the clad layer 526 composed of a p-type AlGaN layer and the contact layer 527 composed of a p-type GaN layer. As the method of this crystal growth, a method of MOCVD or MBE is considered. In this case, Si, for example, is doped in a case of forming a n-type layer and Mg, for example, is doped in a case of forming a p-type layer. Otherwise, Ge for forming a n-type layer and Zn for forming a p-type layer can be doped. Further, a well-known technology is disclosed in the Japanese laid open patent application: 4-297023, for example, to complete crystal growth.

Next, Mg included in the clad layer 526 and the contact layer 527 is activated by annealing process. Then, the columnar portion 530 is formed by etching the p-type contact layer 527 and the part of the n-type contact layer 523 on its way via dry etching.

(2) The insulating layer 506 is formed successively around the columnar portion 530. The insulating layer 506 is formed by the same process for forming the insulating layer 106 in the first embodiment. The insulating layer 506 obtained in this process has the same structure of the insulating layer 106 in the first embodiment. Namely, the upper surface 506c of the insulating layer 506 is located at the position that is higher than that of the upper surface of the columnar portion 530. Here, in this process, the insulating layer 506 is formed so as to expose a part of the contact layer 523 in order that the second electrode 509 is formed on the contact layer 523.

(3) Next, the first and the second electrodes 507 and 509 are formed by a vacuum evaporation method. Further, in this process, the emitting surface 508 is formed on the upper surface of the columnar portion 530. Here, a desirable shape of the surface can be obtained by a lift off method. Otherwise, the first electrode and the second electrodes 507, 509 can be formed by a dry etching method. Then, ohmic contact is formed by annealing process after forming these electrodes.

(4) Further, the fluorescent layer 512 is formed on the emitting surface 508. The fluorescent layer 512 is formed by a ink jet method as well as a method for manufacturing an optical member in the process of the surface-emitting light-emitting device 200 of the second embodiment as mentioned above. In detail, a solution, in which fine particles of the fluorescent material are dispersed, is ejected on the emitting surface 508. Then, the solution is introduced into the region inside of the bank 510 so that the fluorescent layer 512 is formed by volatilizing a solvent. Here, a solvent is volatilized under the appropriate temperature for solvent's vaporization.

The surface-emitting light-emitting device 500, as shown in FIG. 19 and FIG. 20, can be obtained by the above-mentioned process.

Functions and Effects

The surface-emitting light-emitting device 500 and the manufacturing method thereof have the following functions and effects.

(1) The fluorescent material in the fluorescent layer 512 is excited by ultraviolet light as exciting light generated from the light-emitting element 502 since the fluorescent layer 508 is formed on the emitting surface 508. Hence, light having specific wavelength is produced thereby. Thus, light of its wavelength depending on the fluorescent material in the fluorescent layer 512 can be emitted outside from the fluorescent layer 512. Namely, light of its wavelength differing from that of light generated by driving the device 500 can be produced thereby.

(2) The upper edged portion 510a of the bank 510 is formed on the position that is higher than the emitting surface 508 and the fluorescent layer 512 is formed inside the region of the bank 510. Hence, it is possible that the fluorescent layer 512 can be installed accurately on a specific place.

Further, the upper surface 510b of the bank 510 is formed on the position that is higher than the emitting surface 508. Hence, it is possible that the fluorescent layer 512 can be installed stably inside the region of the bank 510.

(3) The upper edged portion 510a of the bank 510 is formed on the position that is higher than the emitting surface 508. Hence, it is easy to align the position of the fluorescent layer 512 when it is formed and yield can be improved.

(4) The fluorescent layer 512 is formed by ejecting a material for forming the fluorescent layer 512 in an area inside the bank 110. Hence, it is possible that the surface-emitting light-emitting device 500, where the position of the fluorescent layer 512 is accurately aligned, can be formed simply with high yield.

Sixth Embodiment

Figure 21:
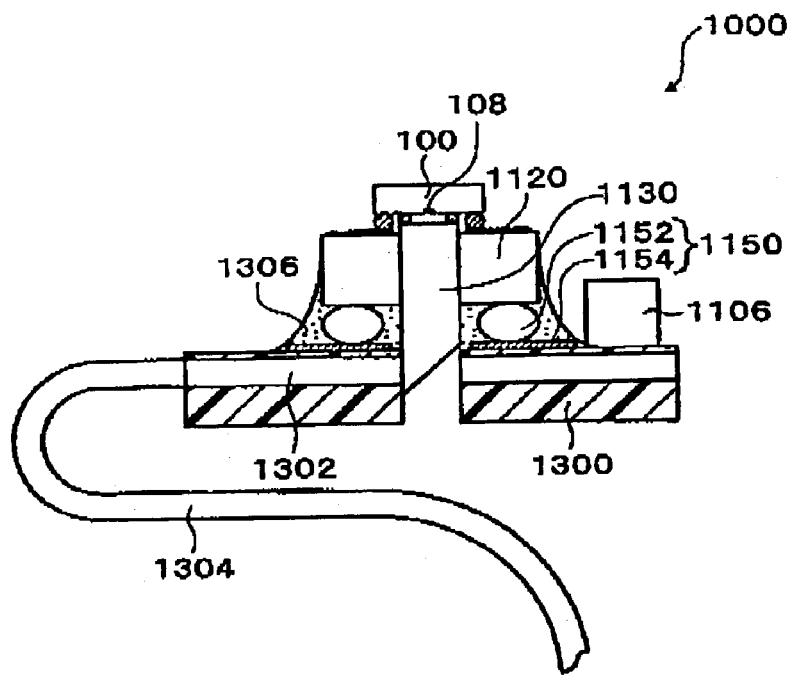
FIG. 21 schematically shows the optical module according to the sixth embodiment of the present invention.

FIG. 21 schematically shows an optical module with respect to the sixth embodiment of the present invention. The optical module with respect to the present embodiment includes a structural body 1000 (See FIG. 21). A structural body 1000 includes the surface-emitting light-emitting device 100 according to the first embodiment (see FIG. 1), a platform 1120, a first optical waveguide 1130 and the actuator 1150. Further, this structural body 1000 includes a second optical waveguide 1302. The second optical waveguide 1302 is a part of the substrate 1300. It is permitted that the second optical waveguide 1302 is optically connected to an optical waveguide for connection 1304. It is also permitted that the optical waveguide for connection 1304 is an optical fiber. Further, the platform 1120 is attached to a substrate 1300 by a resin 1306.

According to the optical module of the present embodiment, a light receiving element (not shown in a figure) receives the light via the first and the second optical waveguides 1130 and 1302 (and the optical waveguide for connection 1304) after the light is emitted from the surface-emitting light-emitting device 100 (the emitting surface 108, see FIG. 1)

Seventh Embodiment

Figure 22:
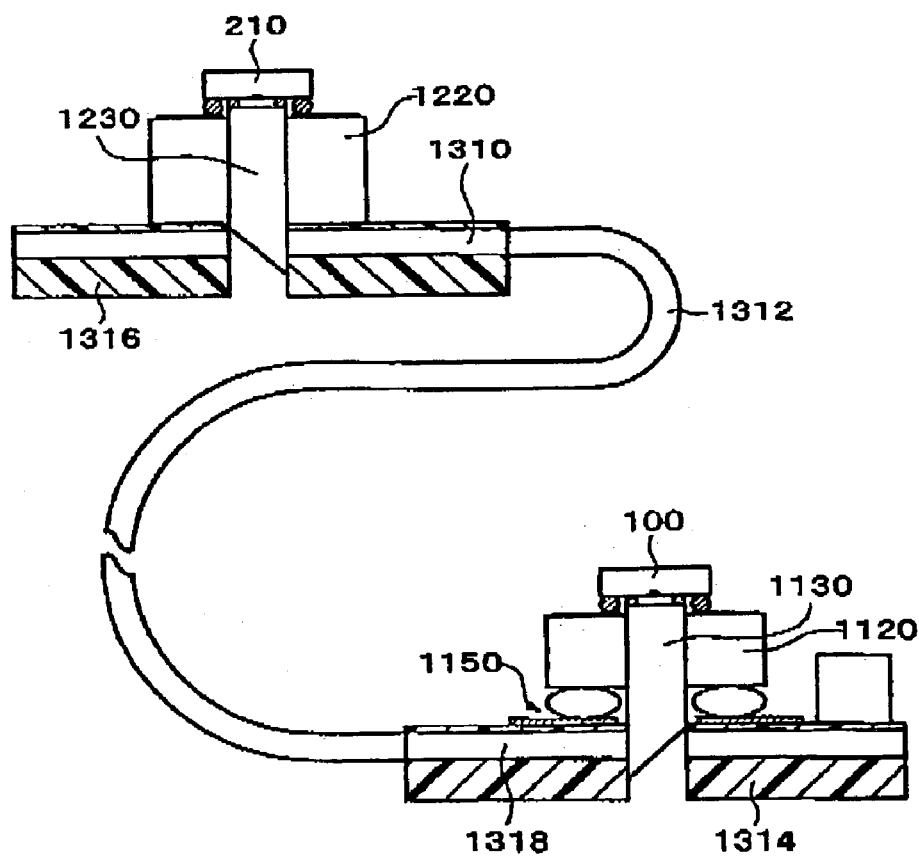
FIG. 22 schematically shows the light-transmission device according to the seventh embodiment of the present invention.

FIG. 22 shows an optical transmission device with respect to the seventh embodiment of the present invention. In the present embodiment, a plurality of the third optical waveguides 1230, 1310 and 1312 are installed between the first optical waveguide 1130 and a light receiving element 210. Further, the optical transmission device with respect to the present embodiment has a plurality (two) of the substrates 1314 and 1316.

In this present embodiment, the third optical waveguide 1312 is located between the structure of the side of the surface-emitting light-emitting device 100 (including the surface-emitting light-emitting device 100, the platform 1120, the first optical waveguide 1130, the second optical waveguide 1318 and the actuator 1150) and the structure of the side of a light receiving element 210 (including the light receiving element 210, the platform 1220, the third optical waveguides 1230, 1310). Light can be transmitted among a plurality of electronics devices by using an optical fiber such as the third optical paths 1312.

Figure 23:
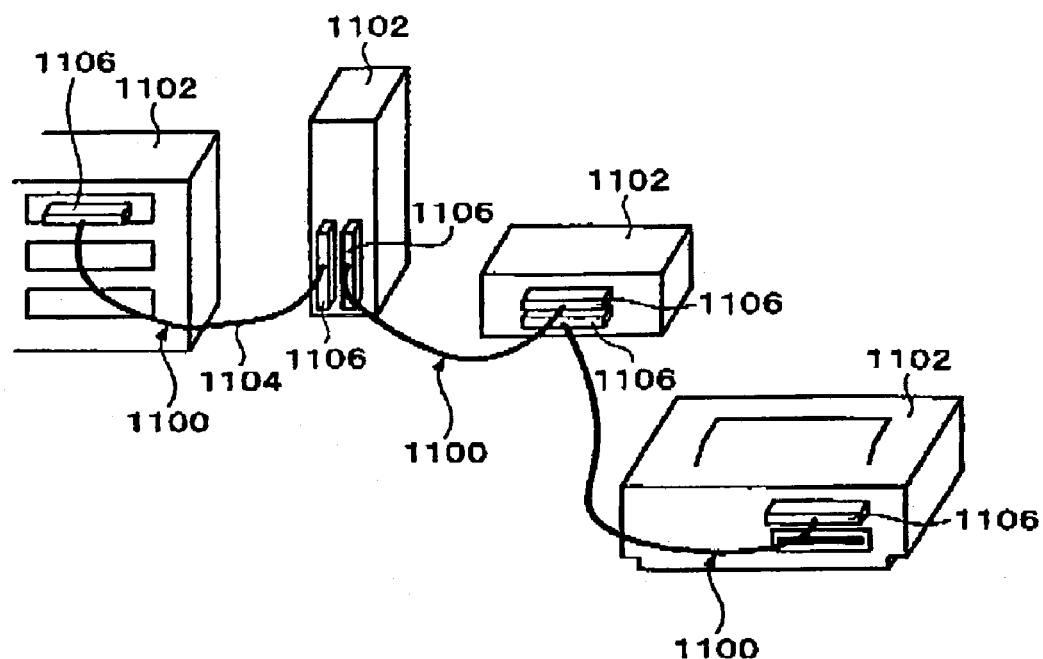
FIG. 23 schematically shows the light-transmission device according to the seventh embodiment of the present invention.

For example, as shown in FIG. 23, electronic devices 1100 such as a computer, a display, a memory device and a printer are connected each other via the optical transmission device 1100. It is permitted that the electronic device 1102 is an information telecommunication device. The optical transmission device 1100 includes a cable 1104 comprising the third optical waveguide 1312 such as an optical fiber. It is also permitted that the optical transmission device 1100 includes a plug 1106 that is installed at the both ends of the cable 1104. The surface-emitting light-emitting device 100 and the structure of the side of the light-receiving element 210 are installed in each plug 1106. Electric signals outputted from any one of the electronic devices 1102 can be transformed into optical signals by the light-receiving element and the optical signals are transmitted via the cable 1104 and converted into electric signals by the light-receiving element. Thus, according to the optical transmission device 1100, information can be transmitted among electronic devices 1102 by optical signals.

Figure 24:
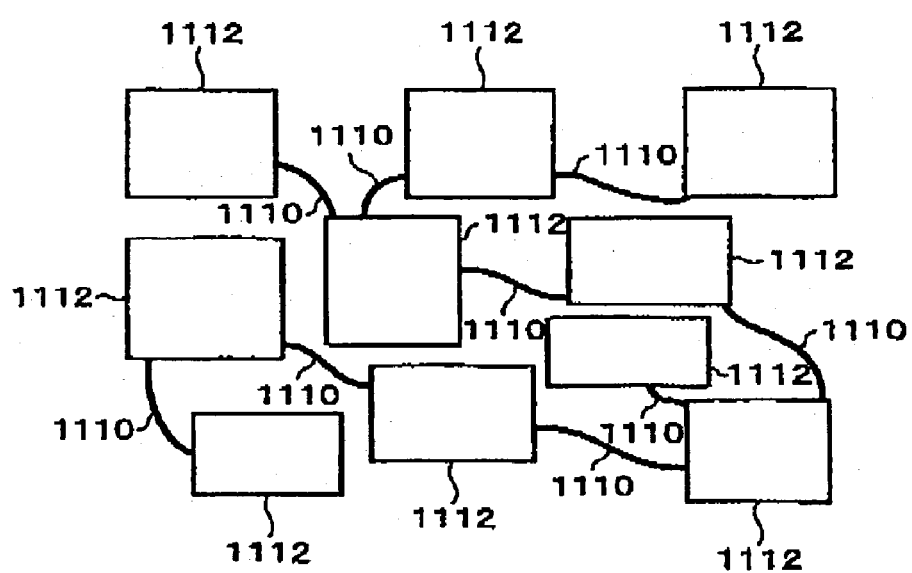
FIG. 24 schematically shows the state of using the light-transmission device according to the seventh embodiment of the present invention.

FIG. 24 shows the state of using an optical transmission device according to the embodiment of the present invention. Electronic devices 1112 are connected each other by an optical transmission device 1110. As electronic devices 1112, an liquid crystal display monitor, a CRT coping with digital information (which is used for finance, mail order selling, medical care and education) a liquid crystal projector, a plasma display panel (PDP), a digital TV, a cash register for a retailer for a POS; Point of Sale Scanning), a video player, a tuner, a game player and a printer.

Here, in the six and seventh embodiments (see FIG. 21 to FIG. 24), the same functions and effects can be displayed if the surface-emitting light-emitting device 200 (see FIG. 10), 300 (see FIG. 15), 400 (see FIG. 18), 500 (see FIG. 19) is used instead of the surface-emitting light-emitting device 100.

While the present invention has been particularly shown and described with reference to preferred embodiments thereof, other changes in form and details may be made therein without departing from the spirit and scope of the invention. For example, the present invention includes a structure that is substantially the same of preferred embodiments (which can attain the same functions and the same effects or the same objects and the same results). Further, the present invention includes a structure where prior arts are added to the embodiments described above. Further, the present invention includes a structure where unimportant parts in the embodiments described above are replaced with others. Further, the present invention includes a structure that can attain the same functions and the same effects or the same objects. Further, the present invention includes a structure where prior arts are added to the embodiments described above.

For example, the surface-emitting light-emitting device including a single columnar portion was described in the above-mentioned embodiment. But, the spirit and scope of the embodiment can be maintained even if a plurality of columnar portions are installed in the semiconductor substrate. Further, it has the same functions and the same effects the case when pluralities of surface-emitting light-emitting devices are installed in array.

Further, the spirit and scope of the embodiment can be maintained even if a p-type is replaced with an n-type in each semiconductor layer in the above-mentioned embodiment. AlGAAs type semiconductor material was described in the above-mentioned embodiment. But, a semiconductor material such as GaInP type, ZnSSe type, INGaN type, AlGaN type, InGaAs type, GaInNAs type and GaAsSb type can also be utilized.

What is claimed is:

1. A surface-emitting light-emitting device which emits light in a direction perpendicular to a base, the surface-emitting light-emitting device comprising:
    an emitting surface;
    a bank, which is formed so as to surround the emitting surface; and
    a lens formed above the emitting surface, located in an area inside the bank, and made of resin,
    an upper edged portion of the bank located at a position higher than the emitting surface,
    the lens in direct contact with the emitting surface, the area inside the bank, and the upper edged portion of the bank,
    the lens not being in contact with the upper surface of the bank,
    an uppermost part of the lens is higher than the upper edged portion of the bank.

2. The surface-emitting light-emitting device as defined in claim 1, the upper edged portion of the bank being located at a position higher than the emitting surface by at least 0.5 μm.

3. The surface-emitting light-emitting device as defined in claim 1, an upper surface of the bank being located at a position higher than the emitting surface.

4. The surface-emitting light-emitting device as defined in claim 1, the bank being formed of an insulating material.

5. The surface-emitting light-emitting device as defined in claim 1, the bank being formed of polyimide type resin or fluoride type resin.

6. The surface-emitting light-emitting device as defined in claim 1, further including any one of an interference filter, a wavelength filter, a polarizing filter and a wavelength conversion member.

7. The surface-emitting light-emitting device as defined in claim 1, the lens being formed of an ultraviolet-cured resin.

8. The surface-emitting light-emitting device as defined in claim 1, the surface-emitting light-emitting device being a surface-emitting semiconductor laser.

9. The surface-emitting light-emitting device as defined in claim 8, the base being a semiconductor substrate,
    the surface-emitting semiconductor laser including:
        a resonator formed on the semiconductor substrate;
        a columnar portion which constitutes at least a part of the resonator; and
        an insulating layer covering a side surface of the columnar portion,
    the emitting surface being formed on an upper surface of the columnar portion, and
    a peripheral region of the columnar portion functioning as the bank.

10. The surface-emitting light-emitting device as defined in claim 8,
    the base being a semiconductor substrate, p1 the surface-emitting semiconductor laser including a resonator formed on the semiconductor substrate,
    a recess being formed at a lower surface of the semiconductor substrate,
    the emitting surface being formed on an upper surface of the recess, and
    a peripheral region of the recess functioning as the bank.

11. The surface-emitting light-emitting device as defined in claim 8,
    the base being a semiconductor substrate,
    the surface-emitting semiconductor laser including a resonator formed on the semiconductor substrate,
    a first recess being formed at a lower surface of the semiconductor substrate,
    a layer for adjusting optical path being buried in the first recess,
    a second recess being formed in the layer for adjusting optical path,
    the emitting surface being formed on an upper surface of the second recess, and
    a peripheral region of the second recess functioning as the bank.

12. The surface-emitting light-emitting device as defined in claim 1,
    the surface-emitting light-emitting device being a light-emitting semiconductor diode.

13. The surface-emitting light-emitting device as defined in claim 12,
    the base being a semiconductor substrate,
    the light-emitting semiconductor diode including:
        a light-emitting element section formed on the semiconductor substrate;
        a columnar portion including the active layer which forms at least a part of the light-emitting element; and
        an insulating layer covering a side surface of the columnar portion,
    the emitting surface being installed on the columnar portion, and
    a peripheral region of the columnar portion functioning as the bank.

14. The surface-emitting light-emitting device as defined in claim 1,
    the surface-emitting light-emitting device being an EL element.

15. An optical module comprising the surface-emitting light-emitting device as defined in claim 1 and an optical waveguide.

16. A light-transmission device comprising the optical module as defined in claim 15.

17. The surface-emitting light-emitting device as defined in claim 1, the optical member being in contact with the upper edged portion of the bank.

18. The surface-emitting light-emitting device as defined in claim 1, further comprising a pillar portion, a height of the bank being larger than a height of the pillar portion.

19. The surface-emitting light-emitting device as defined in claim 1, the optical member being in contact with the upper edged portion of the bank, and the upper edged portion of the bank being located higher than an installation surface of the optical member.

20. The surface-emitting light-emitting device as defined in claim 1, further comprising an electrode, at least a portion of the electrode being located in the area inside the bank and underlying the optical member.

21. The surface-emitting light-emitting device as defined in claim 1, the surface of the lens not being in contact with the bank is curved.

22. The surface-emitting light-emitting device as defined claim 1, the surface of the lens not being in contact with the bank is higher than the upper surface of the bank.

* * * * *